United States Patent [19]

Heller et al.

[11] Patent Number: 4,907,230
[45] Date of Patent: Mar. 6, 1990

[54] APPARATUS AND METHOD FOR TESTING PRINTED CIRCUIT BOARDS AND THEIR COMPONENTS

[76] Inventors: Rik Heller; Henrick Y. Krigel, both of Protech, Inc., 4204 Gardendale, Suite 110, San Antonio, Tex. 78229

[21] Appl. No.: 162,194

[22] Filed: Feb. 29, 1988

[51] Int. Cl.[4] .............................................. G01R 31/28
[52] U.S. Cl. .................................... 371/22.1; 371/68.3
[58] Field of Search ..................... 371/20, 25, 16, 15.1, 371/16.1, 16.5, 22.1, 22.4, 22.5, 22.6, 24, 25.1, 67.1, 68.1, 68.3

[56] References Cited

U.S. PATENT DOCUMENTS

| | | | |
|---|---|---|---|
| 4,713,815 | 12/1987 | Bryan | 371/20 |
| 4,728,883 | 3/1988 | Green | 371/20 |
| 4,761,607 | 8/1988 | Shiragasawa | 371/20 |
| 4,771,428 | 9/1988 | Acuff | 371/25 |
| 4,794,599 | 12/1988 | Purcell | 371/20 |
| 4,810,958 | 3/1989 | Mogi | 371/20 |

*Primary Examiner*—Michael R. Fleming
*Attorney, Agent, or Firm*—Ann C. Livingston

[57] ABSTRACT

Apparatus and method for testing electrical circuits, especially printed circuit boards containing a number of integrated circuit components. Access to the component to be tested is by means of a clip with driver/sensor pins having field effect transistor circuitry. Each pin corresponds to an access point on the device under test, and each pin includes its own circuitry for driving the inputs and sensing the outputs of both analog and digital components. The test instrumentation is integrated with a host microcomputer, eliminating the need for "memory behind the pins". Test programming directs the test instrumentation to perform functional testing while the components are in circuit and to test for in-circuit component parameters. The invention provides automatic test generation, including means for learning the characteristics of known good components and boards. The invention also provides expert system programming for recording and analyzing test results data and for using this data to generate faster tests.

53 Claims, 10 Drawing Sheets

PIN CLUSTERS 600

LEVEL SHIFTER FOR
PIN CLUSTER NO. "X"

FET CIRCUIT FOR
CLUSTER NO. "X"

SENSOR CIRCUIT 800
FOR CLUSTER NO. X

| | |
|---|---|
| COMMENT LINE | 1. REM 7400 QUAD 2-INPUT NAND GATE |
| NUMBER OF PINS ON IC | 2. PIN 14; |
| SETS COMPILER MODE | 3. SLEW; |
| SETS LOW/HIGH THRESHOLDS AND LOW/HIGH DRIVE | 4. SET (VLT,0.6),(VHT,2.4),(VLD,0.0),(VHD, 5.0) |
| SETS GROUND AND Vcc | 5. IL 7; IH 14; X; |
| | 6. IL 1,2; OH 3; X; |
| | 7. IH 1; X; |
| | 8. IL 1; IH 2; X; |
| | 9. IH 1; OL 3; X; |
| | 10. OX 1,2,3; X; |
| | 11. IL 4,5; OH 6; X; |
| | 12. IH 4; X; |
| | 13. IL 4; IH 5; X; |
| | 14. IH 4; OL 6; X; |
| | 15. OX 4,5,6; X; |
| | 16. IL 9,10; OH 8; X; |
| | 17. IH 9; X; |

APPARATUS AND METHOD FOR TESTING PRINTED CIRCUIT BOARDS AND THEIR COMPONENTS

BACKGROUND OF THE INVENTION

1. Table of Abbreviations

AGE—automatic test generation
ATE—automated test equipment
CMOS—complementary metal oxide semiconductor
CPU—central processing unit
CUT—component under test
DAC—digital to analog converters
ECL—emitter-coupled logic
FET—field effect transistor
IC—integrated circuit
PCB—printed circuit board
PCBUT—printed circuit board under test
RAM—random access memory
ROM—read only memory
TTL—transistor-transistor logic
UUT—unit under test

2. Printed Circuit Boards and Components

Printed circuit boards (PCB's), which began to be commonly used in the 1950's. allow components to be packed together more densely, into compact, modular electronic circuits. Another development is integrated circuits (IC's), which may package into one component what was previously the circuitry of an entire PCB. Despite the increased functionality of individual IC's, however, greater complexity at the PCB level continues to result in varieties of IC's interconnected on a PCB.

Many PCB's have analog as well as digital components. Test methods differ depending on whether analog or digital output devices are being tested. Analog testing measures signals that are quantitative and continuous, such as voltage and current. Digital testing compares logic patterns to determine whether they fall within a predetermined pattern of high or low states (binary 0's or 1's), with quantitative values outside threshold high or low ranges being unimportant.

3. Functional Testing

Functional testing is performed while a circuit is under power. Its basic premise is that any circuit can be modeled as a "black box", having an output port and an input port, and having a transfer function that relates the output port to the input port in a predictable way. A functional test determines whether a circuit with a given transfer function operates correctly by determining whether its outputs respond as expected to known stimuli.

Traditionally, functional testing of analog circuits is implemented with various stimulus and measurement instruments such as voltage and current sources, oscilloscopes, and meters. Output signals are measured to determine if they fall within acceptable parameters such as time, voltage, and current. In non-automated testing, a test operator sets up each instrument and makes appropriate connections to the unit under test (UUT).

Functional testing of digital circuits applies digital patterns to circuit inputs and compares the circuit output to expected values. Simple digital circuits use combinatorial, or static, logic, which lends itself to easy testing. A given input state results in a given output state and remains fixed. A truth table describes the digital transfer function, and the correctness of the truth table may be verified. In non-automated testing, logic tracing and signal injection methods, using hardware devices such as logic probes, logic clips, and logic pulsers, are used to find errors in simple digital circuits.

Simulators are a software tool first used in the 1970's to deal with digital logic circuits. Generally, a simulator duplicates the circuit as a computer model. Using this model, the circuit's output pattern for a given input pattern is predicted. Functional testing of digital components became more complex when digital components began to use sequential rather than combinatorial logic and as clock speeds increased. For such circuits, modern types of digital functional testers include signature analyzers, logic analyzers, and emulators.

A significant problem with functional testing is the difficulty of developing test programs. In digital systems, especially, board functional test input may be complex and difficult to specify properly. The test signals must cause digital circuit activity to propagate from the UUT input, through the circuit to the point of fault, and from the fault site to the UUT output.

Functional testing of a PCB may occur at both the board and at the component level. The advantage of component functional testing is that tests are obtainable from a common set of industry components, but unless the components can be disconnected during the test, the in-circuit effects of the rest of the circuit must be considered. Thus, at the component level, functional testing differs according to whether the component under test can be disconnected from other PCB circuitry. If the component is disconnected, functional testing is simply an end-to-end driving and sensing to determine its operation. When disconnection is impractical, however, the component must be tested in-circuit.

4. In-Circuit Testing

Parallel to the development of testers using functional test strategies came developments in testing components while in-circuit on a PCB. In 1965, General Electric developed a means to electrically isolate and test passive components while they remained in-circuit. This technique led to the use of the term "in-circuit" to describe this type of tester. In-circuit testing attempts to test each component on a PCB for its own parameters. Analog measurements of component parameters, such as resistor values, diode conductance, or voltage levels, may be made.

5. Functional In-Circuit Testing

Functional in-circuit testing of components on a PCB combines features of functional and in-circuit testing. As in passive in-circuit testing, parameter values are verified. In addition, functional testing of each component while the component is under power and in-circuit is performed. It uses the functional technique of driving inputs and sensing outputs.

Because in-circuit testing looks directly at each component on a PCB as an independent entity, there must be access to the component under test (CUT) and the CUT must be electrically isolated. Access requires an electrical connection to every lead, or "point", of the CUT. Isolation is accomplished differently, according to whether the CUT is analog or digital. For digital IC's, in-circuit testing uses "guarding" techniques developed in the early 1970's. In common terminology and for purposes of this application, "guarding" is performed at "guard points" by "backdriving" current necessary to achieve a desired state at those points.

More specifically, in a functional test of an IC, power must be applied to the IC. If the IC is in-circuit, because of interconnections among IC's on the printed circuit board under test (PCBUT), power will also be applied to the other IC's. Thus, when the tester applies a logic level to an input of the CUT, it may find that the input is being held in an opposite state by the output of another IC. By using backdriving, the output of an upstream interconnected component is overridden and the input of the CUT is forced to a desired state.

A disadvantage of in-circuit testing is that in-circuit testing consists of a sequence of test on individual components, and even if individual components test as "good", the PCB on which they are mounted may not necessarily function correctly. For example, an in-circuit test will not detect opens and shorts on the PCB between IC's. Other shortcomings of many present day in-circuit testers are the inability to perform analog testing and the inability to test certain active components, such as relays, operational amplifiers and voltage regulators.

6. Pin Electronics

Today's PCB's have hundreds of circuit connections, or points. Test fixtures eliminate the need to make wire-to-point connections from the tester to the UUT. Regardless of the type of fixture, access to points on the UUT is via "pins" on the fixture. Fixtures differ as to the number of pins per fixture and the extent to which stimulus and measurement units are dedicated or shared among pins.

Traditionally, functional testing has been associated with board edge connectors for board level testing, and with probe fixtures for interconnections testing. In-circuit testing has been associated with bed-of-nails fixtures, with tester pins for access to points on the PCBUT in a one-to-one correspondence. A disadvantage with bed-of-nails fixtures is the need for extensive preparation. The fixture is unique for each PCB, with fixture pins placed and wired to correspond to the PCBUT points. These fixtures must provide electrical connections to every node in the circuit board, making reliable fixtures difficult and expensive to manufacture.

Many digital pin circuits include "tester per pin" or at least "RAM behind the pins" to assist in test vector generation and test execution. Although these architectures permit high-speed testing and individual configuration of tester pins, a disadvantage is the high cost and high parts count per pin. Another shortcoming of many test pin architectures is the inability to provide both analog and digital stimulus and measurement.

7. Automated Test Equipment, Automatic Test Generation and Expert Systems

In general terms, automated test equipment (ATE) is "automated" in the sense that it performs tests with minimal operator intervention. Modern ATE uses a computer to store information about a known-good circuit, thereby creating a "model" and eliminating the need to compare the UUT to an actual known-good device. A test program generates electrical signals and applies these signals in a preprogrammed sequence as input to the UUT. The test program then accepts output signals generated by the UUT, which it compares to the stored model.

The most recent ATE provides peripherals for program storage, program generation, printout, and display. For example, ATE systems have been developed that test a PCB at the board level for shorts and opens. Then, each component may be accessed, isolated, and tested one at a time. Various fixtures connect circuit nodes to either analog or digital test instrumentation. The specific type of test to be performed in under computer control and is directed by a test program developed for that PCB.

Other recent developments is ATE have been combining test strategies at the component level. Thus, for example, in-circuit techniques are used to access and isolate components, with functional techniques ensuring that the component is tested for proper operation in its particular environment.

In-circuit ATE takes advantage of the fact that components are isolated. Ideally, the test parameters are the same for a particular component in circuit and out of circuit. To set up a test program, a known good component is identified and given a value. For passive components, this value will be in terms of analog measurements. For digital devices, these values will be the truth table associated with its standard part number. These parameters are electronically stored in a component library. Then, to test a PCB, the ATE successively obtains parameters from the CUT and compares them to the stored values. A disadvantage with many ATE systems, however, is an inability to automatically modify the out-of-circuit "ideal" to the actual in-circuit conditions. An example is when multiple pins of an IC are intentionally shorted together.

Another disadvantage with much of even today's most advanced ATE is a limited ability to test a wide variety of components. For example, a problem in the past has been the difficulty of combining circuitry for analog and digital testing in the same pin electronics. The test equipment must contend with the difficulty of maintaining a low resistance to the test instrumentation for analog circuitry while at the same time operating with high slew rate digital signals. The inherent difficulty of combining analog and digital testing is even more pronounced because of the fact that digital circuits are tolerant of parametric variations, in the sense that voltage levels are above and below certain thresholds, whereas the purpose of analog testing is to measure such variations.

Another disadvantage is the cost and size of many current ATE systems. Although several "benchtop" testers were developed in the early 1970's, they were not computer controlled, and were limited to basic parametric and some functional tests. In the 1980's, the availability of low cost microcomputers began to make smaller ATE systems feasible, but the versatility of such testers has been limited because of the difficulty of performing more than a single test strategy and of combining analog and digital test circuitry.

8. Automatic Test Generation and Expert Systems

Generally, automatic test generation for PCB testing consists of assembling boards specific and component specific information into a test for the populated PCB. With known PCB's and IC's, libraries are developed to store test models and corresponding test data. Once these model IC's are stored, additional programming is used to assemble test procedures for the IC's and for PCB's on which they are mounted. The operator enters information about the PCB and its components to the ATE. The ATE uses this information to find a test for each component on the board in a test library in the ATE's memory. When the appropriate tests are found, the ATE assembles them into a test program for the entire PCB.

The extent to which the operator must input independently obtained data is directly related to the complexity and sophistication of the test programming. For example, for unknown components, the tester must use a simulator to extract test vectors from a known-good digital component or otherwise obtain data about a known-good component from the test operator. The incorporation of a simulator for automatic test development is expensive. If the test vectors are to be supplied by the test operator, a disadvantage of many ATE's is the absence of a high level test language that simplifies the task of entering test vectors.

A recent development in ATE is the use of expert system technology to acquire and analyze test data. A knowledge base of test results may be created to aid in predicting and diagnosing failures. The extent to which the expert system program is used to modify test procedures is a function of the programming sophistication and complexity.

SUMMARY OF THE INVENTION

One object of the invention is to provide an automated test system that is integrated with a standard host microcomputer, without limiting the processing capabilities of the computer for other applications.

Another object of the invention is to provide power to the UUT, isolated from the system power supply.

Another object of the invention is to use the memory of a standard host microcomputer rather than memory at the driver/sensor pins of the tester, and thereby reduce the complexity and cost of the test equipment.

Another object of the invention is to detect faults in PCB's at the component level, while the components are in-circuit, without damage to the component.

Another object of the invention is to provide a tester that will test functionally at the board level and at the component level while the components are in-circuit. The invention detects open circuits and short circuits among components. The invention also tests analog and digital components at the component level. It tests IC's for open inputs, pins pulled to the power supply or to ground, and for shorts between inputs and outputs, and for internal IC failures.

Another object of the invention is to provide a system that will test a component under any set of operating conditions under which the component is specified to properly function.

Another object of the invention is to provide access to individual components on a PCB for in-circuit testing without the need for a "bed of nails" fixture or the need to use a different fixture for each type of PCB or IC. A single clip fixture may be used to provide access to a specified number of leads on an IC or any lesser number of leads.

Another object of the invention is to provide a system that will test all types of PCB's, including PCB's with analog as well as digital components. The invention permits parameters such as resistance and voltage to be measured, and thus current to be calculated. Specific devices that the invention will test are: TTL logic families, CMOS logic families, ECL logic, op-amps, voltage regulators, D/A and A/D converters, linear digital devices.

Another object of the invention is to automatically provide six different tests to each digital component: (1) clip contacts, (2) opens, (3) shorts, (4) voltages prior to test, (5) internal IC functional test, and (6) final test voltage.

Another object of the invention is to integrate various functional and in-circuit tests so that they can be performed from a single pin on the tester, which accesses a corresponding point on the CUT.

Another object of the invention is to use voltage controlled, low output impedance circuitry to drive selected pins of the component under test. The invention provides pin driving electronics associated with each pin of the tester, comprised of unipolar switches, which simplify and reduce the cost of pin driving electronics, as compared to other testers. They also permit analog and digital testing to be integrated into the same pin electronics.

Another object of the invention is to provide a tester with an automatic test generation programming that permits the test operator to create an efficient test programs in minimum time.

Another object of the invention is to automatically learn the interconnections of a known-good PCB. The invention generates printed circuit board schematic and interconnected diagrams.

Another object of the invention is to provide a tester that is interactive with the test operator. Thus, the invention displays a picture of the DUT to the operator and provides specific instructions as to test strategy.

Another object of the invention is to a provide means for generating tests for IC's that are not already included in the tester's IC library. A test language and compiler are provided so that the characteristics of a known good component may be entered and stored.

Another object of the invention is to automatically learn the differences between a particular component while in circuit and while out of circuit. The invention tests for these differences and modifies out-of-circuit models accordingly.

Another object of the invention is to acquire and analyze test data. The invention stores test and repair data for historical and statistical purposes, and generates reports that can be used by repair persons to repair that PCB. The invention also updates test programs so that the test operator will be directed to the most likely fault at the start of testing. Symptoms can be entered to the invention's programming to guide the test operator to the area of fault.

SPECIFICATION

System Overview

This invention relates to the testing of electronic components, especially PCB's containing IC's and other components. The invention obtains either analog or digital measurements, as appropriate to either learn the characteristics of known good PCB's and their its components or to compare suspected PCB's and their components to known good models. Thus, depending on whether a known good circuit is being learned or a suspected circuit is being evaluated, the resulting data are either "learn data" or "failure data". The unit under test (UUT) is a PCB (PCBUT) for board level testing or a component (CUT) for component level testing.

The tester instrumentation attaches to the CUT by means of a clip, which connects each point of the CUT to a pin of the tester instrumentation. Guard connections are made with either a clip or with guard point fixtures that also connect designated points on the CUT to tester instrumentation pins.

The tester pin electronics include a means for driving stimuli signals from a signal source to the UUT. The drivers switch the stimuli signals to the desired input pins of the UU in accordance with a test program. The pin electronics circuits also receive reference voltages or currents that a comparator compares to the outputs from the output points of the UUT. The outputs from the comparator is returned to the test system processor where they are evaluated against proper known correct responses. The tester pin circuits permit analog or digital testing or both to be performed from the same tester pin circuit at one point on the UUT.

When testing a suspected PCB or component or learning a known good PCB or component, the invention incorporates several different strategies. First, the invention detects shorts and opens among points on the PCBUT. Second, the invention tests functionally, which means that proper operation of each CUT is compared with an in-circuit model or used to modify an out-of-circuit model. Third, the invention tests in-circuit, which means that each CUT can be accessed and isolated so that certain parameters can be measured and compared with known good parameters, or used to establish model parameters.

The common object of these tests is to learn the normal operation of a specific circuit, and once the circuit is learned, to compare the operation of a circuit being tested and identify the parts of the circuit causing differences. If a known PCB or component is being learned for purposes of future testing, the results of these tests are stored in the systems data files to develop a "model" known good circuit, which is stored in the system's data files. If a suspected PCB or component is being tested, the results of these tests are compared with the model.

Tester Hardware

Figure 1:
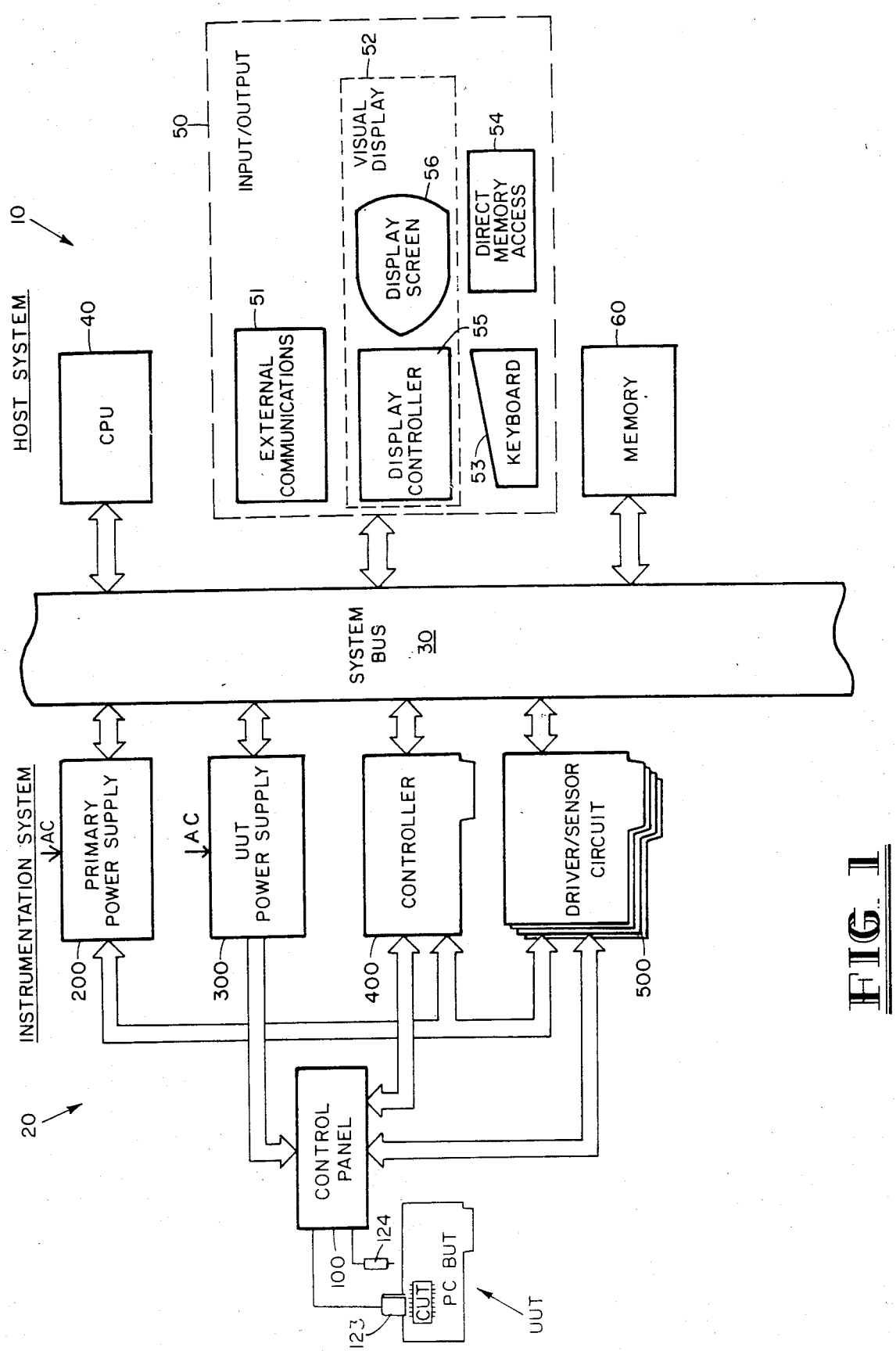
FIG. 1 is a block diagram of the invention connected to a host computer by means of a systems bus.

FIG. 1 is a block diagram of the hardware components of the invention. The right side of FIG. 1 is generally referred to as the tester host system 10. The left side of FIG. 1 is generally referred to as the tester instrumentation system 20. The two systems communicate with each other through system bus 30.

Host system

On the right side of FIG. 1, host system 10 is best embodied by a standard microcomputer and well known input/output peripherals. Host system 10 provides the data processing and operator interface for the invention. In the preferred embodiment, this microcomputer is a Sperry PC IT, which is compatible with the AT microcomputer manufactured by the IBM Corporation. Host system 10 contains at least five expansion slots for standard PCB's.

Host system 10 includes a central processing unit (CPU) 40. In the preferred embodiment, CPU 40 is an Intel 80286 microprocessor, operating at 7.2 megahertz with a backed clock. As in any standard microcomputer, CPU 40 performs arithmetic operations, controls instruction processing, and provides timing signals. CPU 40 connects to system bus 30. In conventional fashion, through system bus 30, CPU 40 cooperates with other well known microcomputer circuits, labelled in FIG. 1 as input/output 50 and memory 60.

Input/output 50 controls the transfer of data between memory 60 and CPU 40 and the peripheral devices. It consists of external communications 51, visual display output 52, keyboard input 53, and direct memory access 54. External communications unit 51 has two serial ports with a maximum capacity of 9600 baud, and two parallel ports. These ports permit output to a printer (not shown) or other output device.

Visual display 32 has a graphics display controller 55 and a high resolution graphics display screen 56. During testing, display screen 56 allows the invention to communicate with the operator through interactive graphic displays that have instructions for running the tests. For example, display 56 provides a graphic of the circuit board under test, interactive representations of connections between the circuit board and control panel 100, and instructions to the operator. For component level testing, both a reference component and the CUT are displayed together with relevant information about each component and their pins. After testing, display 56 provides a summary of test results graphic of the entire board for visual identification of the components tested and the results for each significant component on the board.

In the preferred embodiment, keyboard input 53 has two keyboards: (1) a keyboard with standard alphanumeric keys and ten function keys, for input from the test operator for test program development, and (2) a keypad with 10 function keys for input from the test operator. This is a matter of convenience and the invention can be used with only one manual data entry means such as a keyboard.

Direct memory access 54 permits transfer of data between memory 60 and data storage media, such as hard and floppy magnetic disks. In the preferred embodiment, direct memory access includes a hard disk system and a floppy disk system (not shown). The hard disk system has a hard disk controller and a hard disk drive, which is a 44 megabyte Winchester disk drive. The floppy disk system has a floppy disk controller and two floppy disk drives. One of the floppy drives is capable of handling disks 1.2 megabytes in capacity, the standard size for present day IBM AT computers and compatibles. The other disk drive is capable of handling floppy disks of 360 kilobytes, the standard size for present day IBM XT and PC computers and compatibles.

Memory 60 stores the system programming and data. It is made up of multiple storage locations of binary words. Through systems bus 30, any single memory locations may be read from or written to, depending on whether the memory is random access memory ("RAM") or read only memory ("ROM"). In the preferred embodiment, both RAM and ROM are used. The size of the RAM is 1 megabyte.

Outputs of host system 10 to instrumentation system 20 are address, control, and data signals. The data signals include stimulus and reference values for testing. Inputs of host system 10 from instrumentation system 20 are response signals. Host system 10 also delivers power to instrumentation system 10.

The tester is connected to host system 10 in such manner that the capability of host system 10 for other applications is not impaired. For example, host system 10 could be used for many standard data processing applications.

Instrumentation System

On the left side of FIG. 1, the instrumentation system 20 has five basic parts: control panel 100, primary power supply 200, UUT power supply 300, controller 400, and driver/sensor circuit 500. Primary power supply 200 and UUT power supply 300 are designed to replace the power supply provided with the standard microcomputer of host system 10. In the preferred embodiment, the existing power supply unit has been removed and a unit containing both primary power supply 200 and UUT power supply simply is installed. Instrumentation system 20 is described in further detail below.

Control Panel

Figure 2:
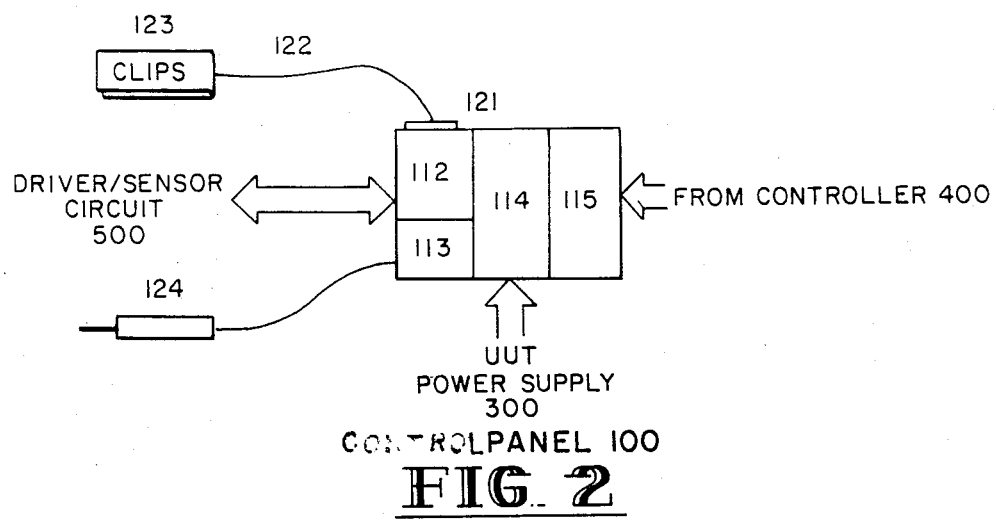
FIG. 2 is a block diagram of the control panel from FIG. 1.

FIG. 2 shows control panel 100, which provides the means for connecting the board under program development or the board under test to instrumentation system 20. Control panel 100 has four parts: test connections 112, guard connections 113, power connection 114, and LED's 115. In the preferred embodiment, the electrical components for these four parts are assembled on four small PCB's, which may be easily connected within host system 10.

Test connections 112 consists of six female connectors 121. Through control panel 100, connectors 121 communicate with driver/sensor circuit 500 through cables 122 and clips 123. In the preferred embodiment, clip 123, is a standard IC clip connector, having an electrical connection to each lead, or "point," of the IC. Clips 123 can be used for an IC with as many as 64 leads, and can be used for any IC with a smaller number of leads. Connectors 121A, 121B and 121D are connected in parallel. Connectors 121C and 121E are connected in parallel. Connector 121F is not connected to any other connector. Points 49 through 64 of connector 121F are guard points.

Guard connections 113 provides six guard point outlets 124A–124F. Guard points 124A–124F control the effect of the rest of the circuit during in-circuit testing of a component. Using guard points 124A–124F and a clip 123 connected to the guard points on connector 121F, points on the circuit may be connected to a power supply level. Guard connections 113 also provide a ground and a synchronization connection to the board under development or test.

Power connection 114 provides DC voltage outlets for 5 volts, −5 volts, 12 volts, −12 volts, and ground, for connection to the board. These voltages are also available from an auxiliary connector (not shown).

LED's 115 indicate whether the system or auxiliary power is on and whether the hard disk drive is direct memory access 54 is being accessed. LED's 115 also communicate to the user which clip connections 121A–121E or which guard points 124A–124F to use, and whether power is on. The control for LED's 115 is from controller 400, as explained below.

Primary Power Supply

Figure 3:
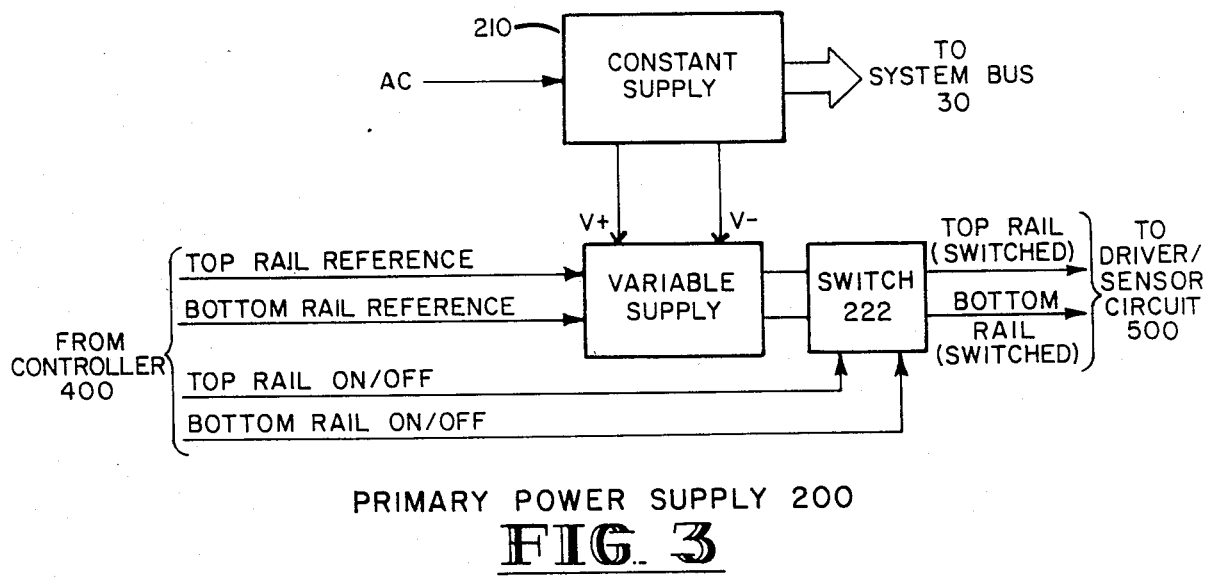
FIG. 3 is a block diagram of the primary power supply from FIG. 1.

FIG. 3 shows primary power supply 200, which is comprised of a constant supply 210 and variable supply 220, and rails switch 222. Constant supply 210 delivers power to host system 10. Constant supply 210 receives AC from a power source and produces a constant voltage difference, which in the preferred embodiment is 15 volts. The high and low voltage levels are represented in FIG. 3 as V+ and V−. These levels are present in host system 10 through system bus 30 and are input to variable supply 220.

Variable supply 220 is a programmable DC power source. One pair of inputs to variable supply 220 is the high- and low-voltage signals from constant supply 210. A second pair is top and bottom rail reference voltages from controller 400.

The output of variable supply 220 is a top rail and a bottom rail to drive driver/sensor circuit 500. In driver/sensor circuit 500, all elements are connected between these rails, which are common top and bottom voltage levels, with the top rail being the higher voltage and the bottom rail being the lower voltage. As will be further explained below, at controller 400, the top rail voltage can be varied between plus or minus 10 volts, and the bottom rail voltage can be varied between plus or minus 10 volts. Typically, the top and bottom rails have a 5 volt difference, which is usually associated with TTL logic. The width and symmetry of the rails, however, permits higher voltage testing for CMOS IC's and negative voltage testing for ECL IC's.

Two control signals, namely top rail on/off and bottom rail on/off, control the output of variable supply 220. These control signals are delivered to rails switch 222, which is a conventional double pole, dual throw, switch. If the control signals to 222 are "on", variable supply 220 delivers top and bottom rail voltages to driver/sensor circuit 500.

The power supplied by variable supply 220 is highly regulated and filtered. When enabled by its control signals, variable supply 220 amplifies the power supplied by top and bottom rail reference inputs, so that high currents may be supplied without a change in voltage.

UUT Power Supply

Figure 4:
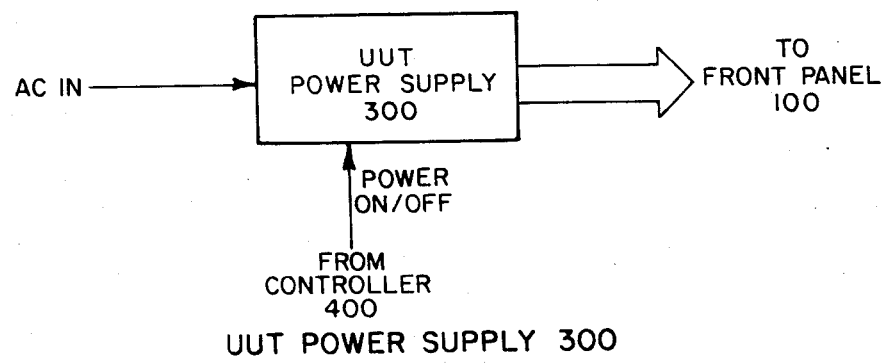
FIG. 4 is a block diagram of the UUT power supply from FIG. 1.

UUT power supply 300 is shown in detail in FIG. 4. UUT power supply 300 is electrically isolated from primary power supply 200. UUT power supply 300 receives AC. UUT power supply 300 also receives an on/off control signal from controller 400. This permits automatic control of power, as governed by sensors in driver/sensor circuit 500.

UUT power supply 300 has a current capability of up to 10 amps. The following table shows the available relationship between current through and voltage across the UUT:

| volts | amps |
|---|---|
| 5 | 15 |
| −5 | 0.6 |
| 12 | 3 |
| −12 | 1 |

Current measurement through the UUT has plus or minus 10 milliamps resolution at all connections.

Controller

Figure 5:
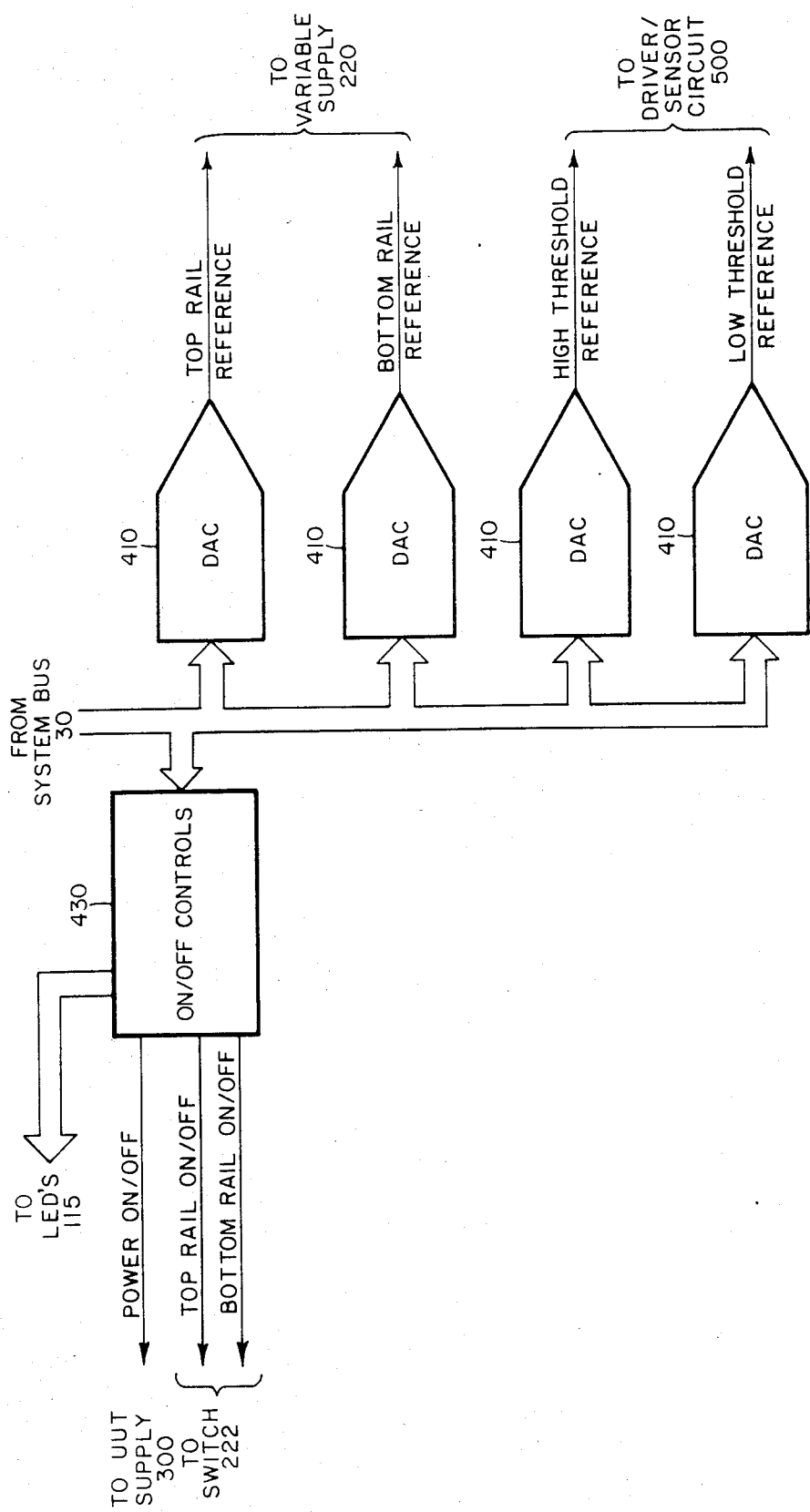
FIG. 5 is a block diagram of the controller from FIG. 1.

Controller 400 is shown in more detail in FIG. 5. Controller 400 has four digital to analog converters ("DAC's") 410. Controller 400 also has on/off controls 430. In the preferred embodiment, the electrical components of controller 400 are assembled on a PCB, which may be easily installed in host system 10.

Controller 400 is connected to system bus 30. Through system bus 30 from host system 10, each DAC 410 receives a digital word that communicates a voltage level to be converted to a predetermined analog voltage. In this manner, each DAC 410 generates one of four reference voltage levels. These four references are: top rail, bottom rail, high threshold, and low threshold.

Top and bottom rail reference voltages pass to variable power supply 220, which, as determined by rails switch 222, may deliver top and bottom rails to driver/sensor circuit 500. High and low threshold reference signals pass to sensors in driver/sensor circuit 500. Their operation will be described in connection with driver/sensor circuit 500.

On/off controls 430 are conventional digital on/off control devices, such as latches, in communication with systems bus 30. Depending on input from systems bus 30, these on/off controls determine the on or off status of the top and bottom rails, the UUT power supply, and LED's, as explained above in connection with primary supply 200 and UUT supply 300.

Driver/Sensor Circuit

Figure 6:
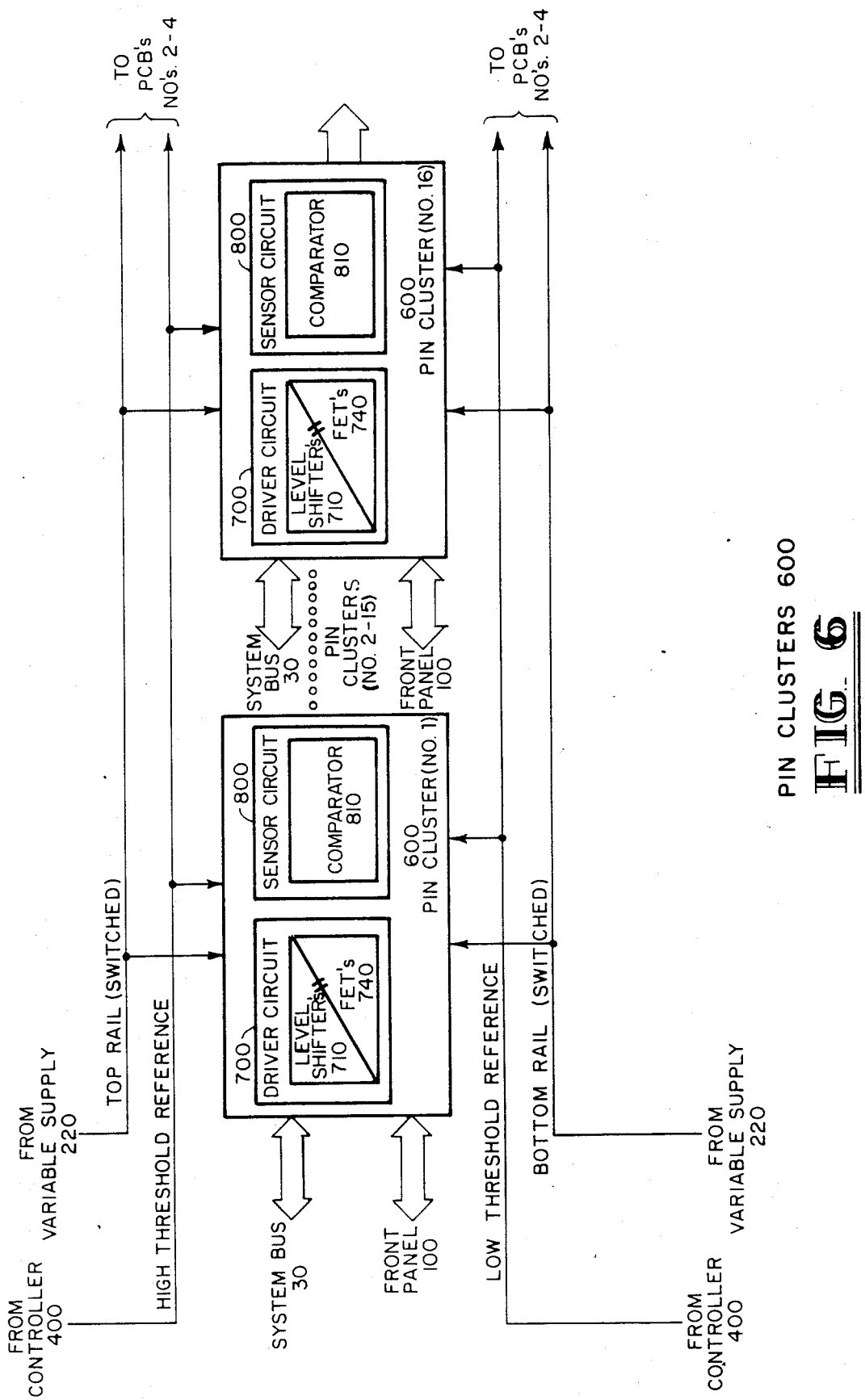
FIG. 6 is a block diagram of the pin clusters for sensing and driving.

Referring again to FIG. 1, driver/sensor circuit 500 is shown, which consists of four PCB's, each containing 16 driver/sensor pin clusters 600, shown in FIG. 6, for a total of 64 pin clusters 600. Each PCB is installed in an expansion slot of host system 10.

Pin clusters 600 communicate with RAM in memory 60 of host system 10 through systems bus 30. This eliminates the need to include memory for each pin cluster 600.

An important feature of the invention is that driver/sensor circuit 500 is designed for use with unipolar switches, in particular the MOSFET or HEXFET FET switches. The use of these switches reduces the amount of electronics necessary for each pin cluster 600, and as explained below, provides analog features.

Generally, pin clusters 600 drive, sense, and switch at points of the UUT. Each pin cluster 600 may stimulate input to a UUT point according to signals determined by host system 10, and sense the UUT's output so that this information can be communicated to host system 10. These pin circuits are thus computer-controlled interfaces between the test system computer and the points of the UUT. More specifically, through input drivers, the pin clusters 600 switch these stimulus signals to the desired input of the UUT in accordance with a stored test program. The pin clusters also receive reference voltages. With comparators, the pin clusters 600 sense voltages from UUT points and compare them to the references. The output signals from the comparators then pass to the tester's computer where they are checked against a stored program for proper response. The structure of each pin cluster 600 is explained in further detail below.

Details of Driver/Sensor Circuit

FIG. 6 represents a PCB containing 16 pin clusters 600. The first and sixteenth pin clusters are shown; the fourteen intermediate pin clusters are represented by the dots between. Four voltage levels are present at each pin cluster 600; a top rail, a bottom rail, a high threshold reference, and a low threshold reference. As explained above, these levels are programmably varied, with the slew rate of changes in voltage to pin cluster 600 being a maximum of 75 volts per microsecond. The driver/sensor skew is a maximum of 50 nanoseconds.

Each pin cluster 600 is associated with its own two basic circuits: a driver circuit and a sensor circuit. Representative driver circuits and sensor circuits are shown in FIG. 6 as 700 and 800, respectively. These two circuits, in turn, are each associated with a single point of the UUT. In other words, associated with each pin cluster No. "X", is a driver circuit, a sensor circuit, and a point No. "X" on the UUT. Each test point on the UUT has its own dedicated pin cluster 600.

Driver Circuit

Referring to FIG. 6, each driver circuit 700 is driven by a top rail and a bottom rail voltage, which as explained above may be varied by means of a programmable power supply. Each driver circuit 700 is drivable from a top rail voltage of plus or minus 10 volts to a bottom rail voltage of plus or minus 10 volts. The impedance through each pin cluster is 1.6 ohms to the top rail and 2.6 ohms to the bottom rail. The driver current with the top rail at 5 volts and a pin voltage of 4 volts is a minimum of 600 milliamps. Driver circuit 700 can be further broken down into two main parts: level shifter circuit 710 and FET circuit 740.

Figure 7:
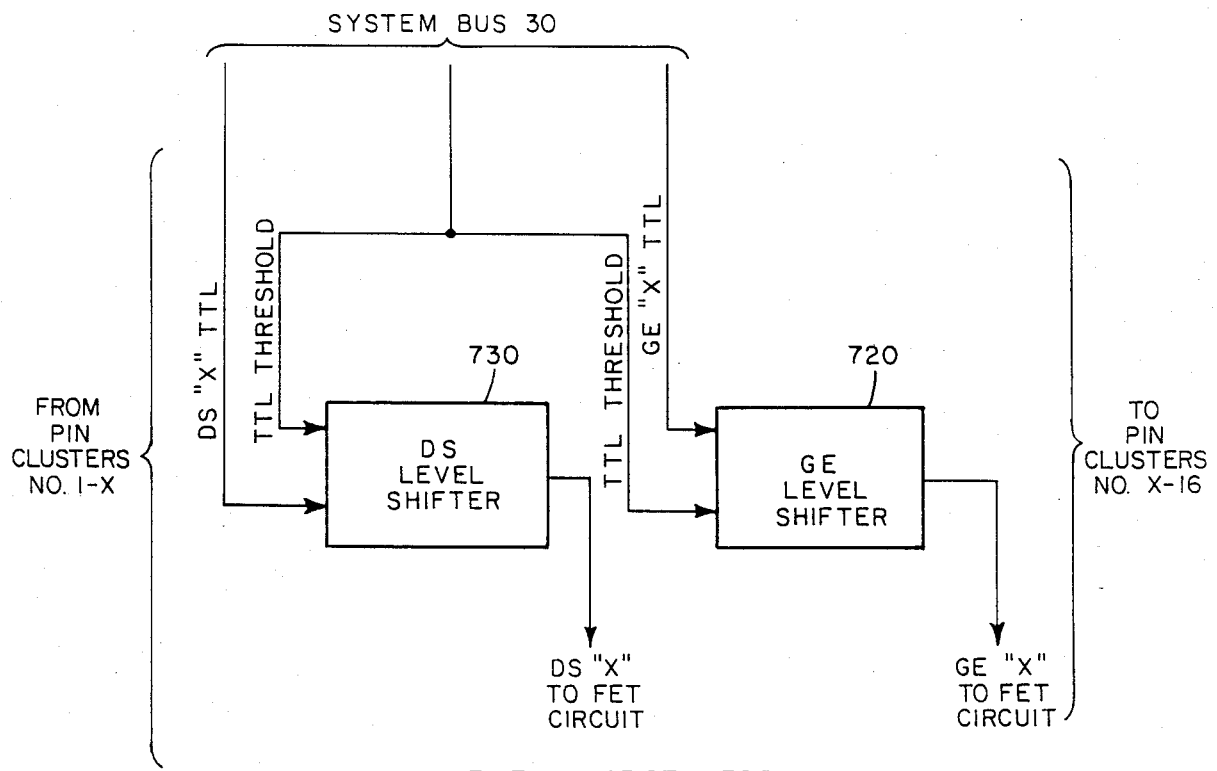
FIG. 7 is a block diagram of the level shifters from FIG. 6.

Level shifter circuit 710 is shown in further detail in FIG. 7. In general, level shifter circuit 710 permits a shifted level output that causes a + supply, − supply, or transition swing of the FET's in FET circuit 740. Level shifter circuit 710 consists of two level shifters: Gate enable ("GE") level shifter 720 and driver/sensor ("DS") level shifter 730. Each level shifter has two inputs. Both receive the same TTL threshold voltage. In addition, GE level shifter 720 receives GE "X" TTL input, and DS level shifter 730 receives DS "X" TTL input. GE "X" and DS "X" are drive enable and drive direction signals.

The outputs of GE level shifter 720 and DS level shifter 730 are related. Thus:

The output of GE level shifter 720, labeled in FIG. 7 as GE "X", is equal to the output of DS "X" if the GE "X" input is greater than the TTL threshold into GE level shifter. Otherwise, GE "X" is high impedance.

The output of DS level shifter 730, labeled in FIG. 7 as DS "X", is equal to the top rail voltage if the DS "X" TTL input is less than the TTL threshold. Otherwise, DS "X" is equal to the bottom rail voltage.

Level shifter circuit 710 can be configured from IC's currently available. Desired features for the particular IC selected are fast speed, clean transitions, and a broad symmetrical voltage range. In the preferred embodiment, a component designated as HI 303, such as is manufactured by Harris or Maxim, is used. As purchased, it is a dual pole single throw switch, configured in the invention to perform as a level shifter.

Figure 8:
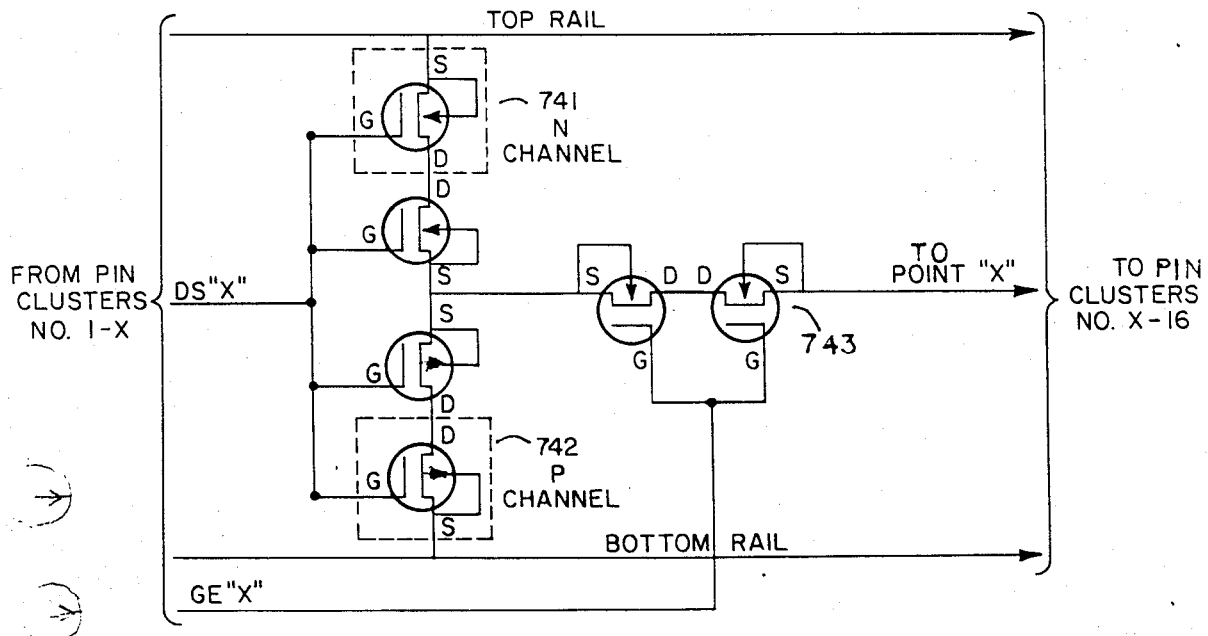
FIG. 8 is a block diagram of the FET circuit from FIG. 6.

FIG. 8 shows FET circuit 740. The outputs of level shifters 720 and 730 are inputs to FET circuit 740. FET circuit 740 consists of a totem pole FET switch, comprised of switch 741 and switch 742, and an enable, switch 743. These switches are characterized by high speed and low output impedance. Compared to bipolar switches, they are a voltage-controlled dependant current source, rather than a current-controlled dependent voltage source. The FET switches permit driving signals to be generated and enabled without a significant drop in voltage and without interfering with the UUT.

Switch 741 is an N channel FET; switch 742 is a P channel FET. The internal resistance from drain to source should not exceed 5 ohms for switch 741 and 10 ohms for switch 742. Due to known principles of state physics of p channel and n channel transistors, when both are driven by the same source, switches 741 and 742 will never be "on" simultaneously.

Switches 741 and 742 are arranged in a push-pull manner with switch 741 on the top rail and switch 742 on the bottom rail. This assumes that (1) the + supply is greater than the positive voltage range of level shifters 720 and 730, which is greater than the positive rail plus the turn-on threshold of switch 741, and (2) the − supply is less than the negative voltage range of level shifters 720 and 730, which is less than the negative rail plus the turn-on threshold of switch 742.

Switch 743 is an enable with input GE "X" from GE level shifter 720. Input GE "X" determines whether the effects of switches 741 and 742 are seen by the system. In other words, switch 743 determines whether the output of FET circuit 740 will go to point "X" on the UUT, or whether it will be isolated from the system. Thus, the effect of switches 741 and 742 may completely predominate or may be completely isolated from the UUT depending on the state of the GE signal, where "on" equals +supply and "off" equals −supply. Arranged in this manner, switches 741 and 742 create a break-before-make switch arrangement, which determines whether the top rail voltage or bottom rail voltage is sent to point "X".

If enabled by FET switch 743, FET circuit 740 imposes its output, which is typically lower resistance by far more than any other outputs of the circuit to which it is electrically connected. Accordingly, FET circuit 740 permits a point on a UUT to be "guarded" for in-circuit testing to eliminate the effects of the rest of the PCB circuit. Guarding with guards 124A-F or clip 121F, which have the same driver circuits 700 as shown in FIGS. 7 and 8, backdrive the output in an upstream component. This forces an input of the UUT to a desired state, regardless of whether the rest of the circuit would normally put this input at another state. To accomplish this, the tester forces the output of the upstream components to which the UUT is connected to the desired state.

An example of the operation of FET circuit 740 is as follows. If GE "X" is asserted, DS "X" and GE "X" may swing from the bottom rail minus the p channel FET "on" threshold to the top rail plus the n channel FET "on" threshold. This means that as DS "X" varies, point "X" may vary from the top rail to the bottom rail, and will clamp to one rail at the appropriate thresholds.

In the steady state, the effect is to clamp the FET's on or off, which guarantees the rail voltage to the output of the circuit. The threshold can be any value between highest low and lowest high specification for the TTL output of the circuit.

When a TTL output is clamped to the voltage opposite its desires, the driver circuit 700 permits it to become clamped to its more natural state. When a TTL output is clamped to its proper state, the FET switch clamping the output to this desired state will be switched off. Thereafter, the off FET will switch "on", pulling the signal up or down and clamping it to the new opposite state.

FET circuit 740 guarantees a high current, on demand clamping between positive and negative rails. It also permits, by means of switch 743, the effect of this clamping to be isolated. When this isolation occurs, if DS equals +supply, then the power consumed is minimal.

If both switches 741 and 742 are "off", the transition time is equal to the slew rate of the level shifters 720 and 730 divided by the absolute value of the difference between each switch's turn-on gate voltage. When the driving circuit 700 is enabled, two states of the UUT are considered under high-to-low and low-to-high switching transitions.

The transition characteristics of driving circuit 700 are critical to the providing of a monotonic voltage increase or decrease in the transition time, especially at the trigger or hysteresis point for the inputs to digital IC's. In the preferred embodiment, FET switches 741, 742, and 743 may be configured from components such as the BQ 3001 manufactured by Siliconix. This component has the desired features of being fast and having a broad symmetrical voltage range.

Sensor Circuit

Figure 9:
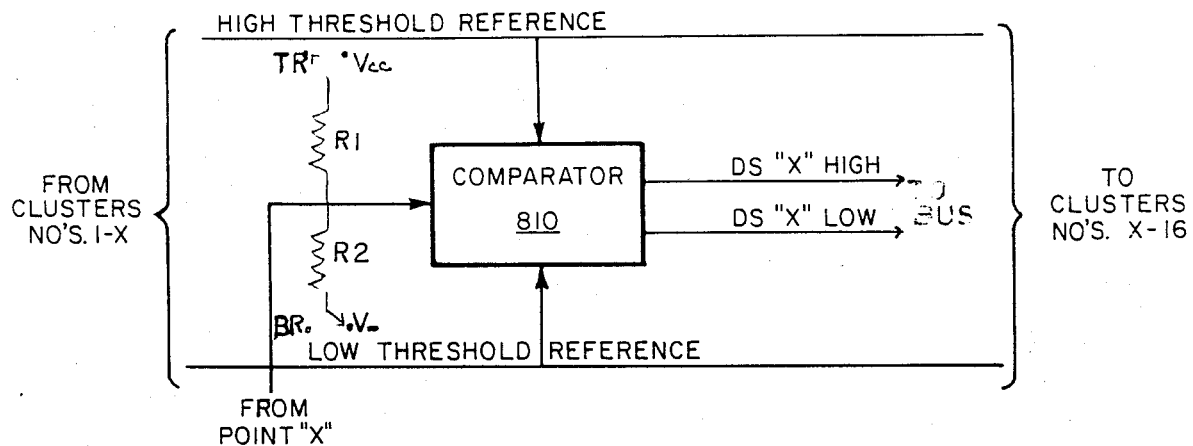
FIG. 9 is a block diagram of the sensor circuit from FIG. 6.

Referring to FIG. 9, sensor circuit 800 receives high threshold and low threshold voltages from controller 400. These voltages are input to a dual threshold comparator 810. A third input to comparator 810 is from a point "X" on the UUT. This third input is compared to each threshold to determine if its value is higher, lower, or in between.

A pair of resistors, namely R1 and R2, is electrically connected in series on either side of point "X" of the UUT. R1 is in connection with either the top rail or V+; R2 is in connection with either the bottom rail or V−. As will be explained below, this arrangement permits impedance at point X to be detected. In the preferred embodiments, resistors R1 and R2 are 2 and 1 megaohms, respectively.

Sensor circuit 800 detects whether the output at point X is higher than a high threshold or lower than or low threshold. Sensor circuit 800 has one of two TTL outputs, either low or high. Driver/sensor "X" High is asserted if the voltage at point "X" is higher than the high threshold voltage. Driver/sensor "X" Low is asserted if the voltage at point "X" is lower than the low threshold voltage. The output from comparator 810 is communicated to host system 10 through systems bus 30.

The sensor range is plus or minus 10 volts. The sensor threshold accuracy is plus or minus 50 millivolts, with resolution down to 5 millivolts. A typical step period is 10 microseconds, with a minimum of 1 microsecond. The clock verb is 2 microseconds per period.

Operation of Test Instrumentation

To operate the invention to learn a known good PCB or component, or to test a suspected PCB or component, various measuring, driving, and sensing techniques are used. These techniques are associated with various algorithms, which are derived from electrical engineering principles well-known to those in the field of electrical engineering. The algorithms are based on the fact that certain errors produce known results, which can be electronically detected. The algorithms used in the invention are "heuristic" in the sense that they automatically change themselves according to past experience, using expert system programming techniques. As will be explained below, examples are modification of out-of-circuit models to reflect in-circuit conditions and enhancing test speed according to results of prior tests.

Several tests and algorithms are described below. As explained, the tests for connections, opens, and voltage are passive, in the sense that no driving signals are supplied through driver circuit 700. The shorts test and functional test are active.

One algorithm is used to determine connections between a CUT and clip connector 121, for a contacts test. When learning contacts on the CUT, all possible relationships of pins of clip connector 121 and points of the CUT are considered while the PCBUT is under power. The contacts test identifies IC points having a "normal" resistance referenced to ground, which in the preferred embodiment is less than 1 megaohm. If the point behaves as if there is no load, defined as any load greater than one megaohm, the point is said to have no contact. This resistance measurement is accomplished with resistors R1 and R2 shown in FIG. 9. Resistors 820 are switched so that R1 is in connection with V+ and R2 is in connection with V−. When the voltage is sensed at point X, it should be some predetermined value, as determined by using the voltage division principle. If this expected value is present at point X, it is assumed that no load is attached. When an IC's connections are being learned, its high impedance points are specified so that they will not be tested for clip contact.

The opens test is run only at input points of the CUT. When an IC input point is not connected to an output, its voltage is tristate and floats between a high and low state. During the opens test, the test instrumentation takes advantage of the internal voltage division at those CUT points between the top rail voltage and bottom rail voltage. Resistors R1 and R2 are switched so that R1 is in connection with the top rail and R2 is in connection with the bottom rail. To test a component, the sensing circuit 800 detects the static voltage at the CUT input point and comparator 810 is used to determine whether the point is an actual high or low. If there is no such measurement, a non high or low condition is detected and it is assumed that there is no output loading that input. An open trace on the PCB to that CUT point is assumed. When a known good component is being learned, open input points are detected in this manner and the out-of-circuit model is modified accordingly so that the opens test is disabled for these points. The test is also disabled for CUT points that are tied to tristatable outputs.

To detect voltages, the output of CUT point X is sensed by comparator 810. If a component is being learned, "successive approximation" algorithm is used. Comparator 810 compares the output of the CUT point to high and low thresholds provided by host system 10. If the output of the CUT is lower than the low threshold or higher than the high threshold, software in host system 10 varies the thresholds, sending the new desired values to the appropriate DAC 410. When the high and low thresholds are "close" and the output of the CUT is between these values, the measurement has been obtained. If a suspected component is being tested, the references of a known good component are supplied to comparator 810 by host system 10, and the output at point X is simply compared to determine whether it is within range.

To determine shorts between pins, the tester uses the fact that when two pins are shorted, the outputs driving those pins oppose each other. One attempts to pull the input pins high, while the other attempts to pull them low. A process of considering possible relationships among points of the CUT is used. In succession, pairs of points are driven by FET's 740. Resistors R1 and R2 are in connection with the top and bottom rails, having been switched to these positions. With sensing circuit 800, it can be determined whether the two corresponding FET's 741 and 742 are attempting to pull each other in opposite directions, namely to both the top and bottom rail. This will result in the voltage at point X being between the expected voltage for either the high rail or low rail. If the voltage at point X is this intermediate value, a short is assumed between the points being tested.

The shorts test includes a test for IC pins stuck to Vcc or ground. When the shorts test is enabled on stuck IC pins, a step function at 100 nanoseconds is applied, switching from one voltage to another. A test is then performed to determine if there has been a change in voltage across the IC pin.

The algorithm for functional testing is essentially to drive input and to sense output. FET's 740 are used to drive and guard inputs. Comparators 810 sense outputs. If a suspected component is being tested, the outputs are compared to references supplied to comparator 810. If a known good component is being learned, there are several considerations so that the out-of-circuit model test may be appropriately modified. First, if input pins are shorted to one another, the driving is removed from all but one pin. Second, if outputs are shorted to inputs, the input stimulus is removed when the test programming calls for sensing at the output. Third, if the test programming requires the output to be sensed, the out-of-circuit model's sense is overwritten by the in-circuit learned sense.

Tester System Software

Operating System and User Interface

Figure 10:
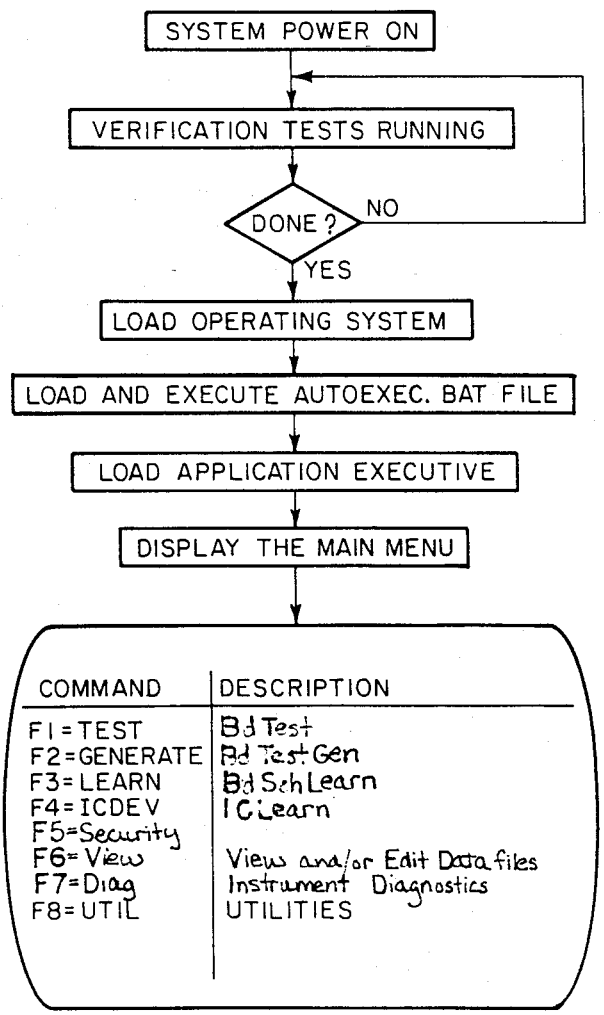
FIG. 10 is a flowchart showing the relationship between the operating system, the operator interface, and the system programming.

FIG. 10 is a flowchart showing the relationship between the operating system, the operator interface, and the system programming. The operating system in the preferred embodiment is MS-DOS and can be used with standard BASIC commands. This permits the invention to be used with a standard host system 10, and permits the same host system to use off-the-shelf applications programs such as for database and word processing. Generally, the operating system controls input and output and assigns memory space to programs and data. Each program of the invention checks with the operating system to determine where to locate data files.

FIG. 10 shows how a menu driven user interface controls access to a number of application and utility programs. The utility programs assist the user in maintaining data files and perform housekeeping tasks such as copying files.

In general, the application programs accept data from data files or from operator input to generate and execute test programs. In order to test a circuit, the invention requires the operator to connect the system to a physical circuit to be tested, to enter information about the normal operation and characteristics of that circuit, and to enter information about the normal operation and characteristics of each component.

Test Programming and Data Files

Figure 11:
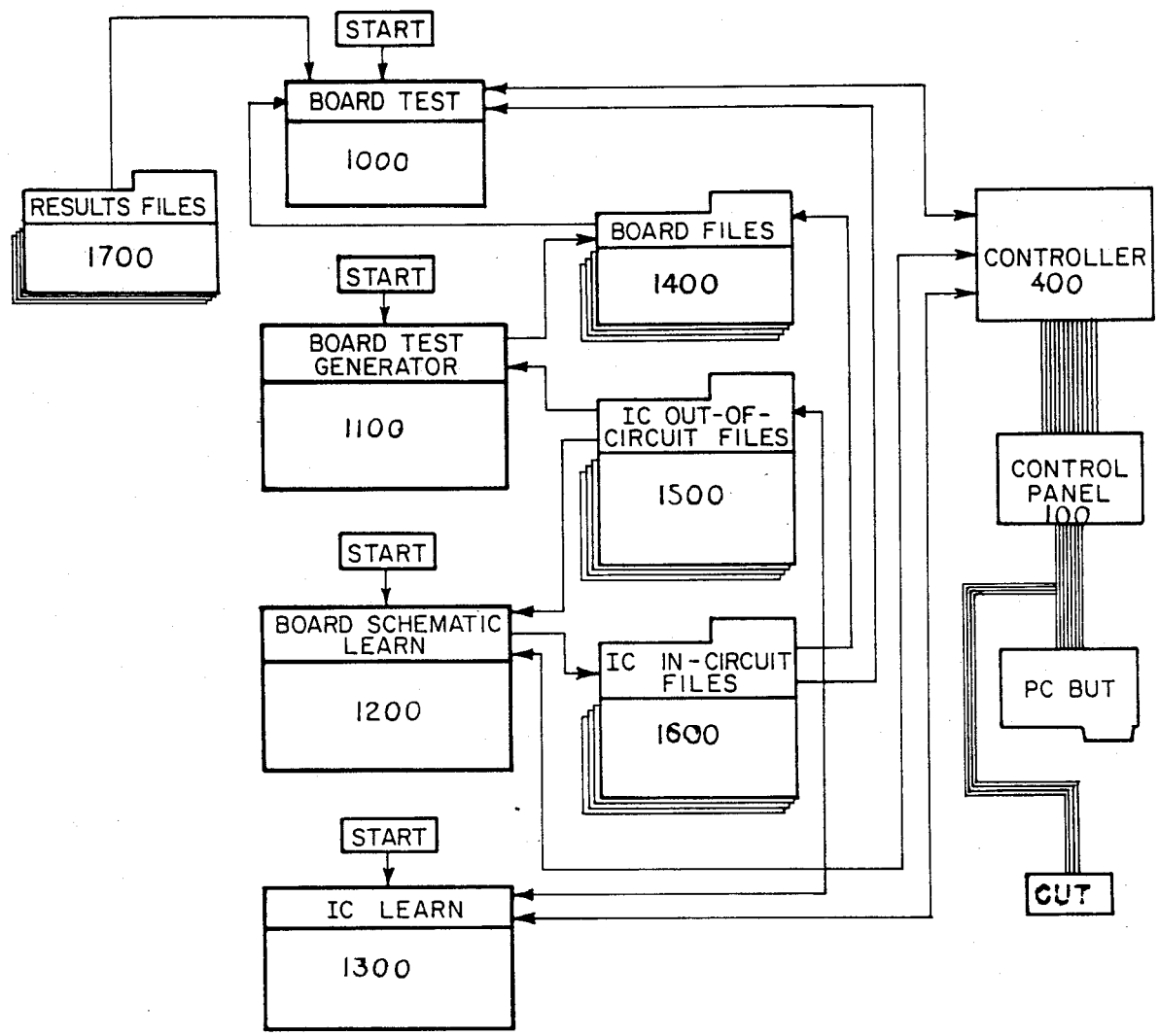
FIG. 11 is a block diagram showing the relationships between the system programming and data files.

FIG. 11 is an overview of the flow and storage of test information, as determined by the system software. The system programming can be generally divided into a number of parts: board test ("BdTest") 1000, board test generator ("BdTestGen") 1100, board schematic learn ("BdSchLearn") 1200, and IC learn ("ICLearn") 1300. Data files are: board files ("BdFiles") 1400, IC out of circuit files ("ICOutFiles") 1500, and IC in-circuit files ("ICInFiles") 1600, and results files ("ResultsFiles") 1700. Data files may be stored on floppy or hard disks in direct memory access 54.

In operating the invention to learn or test a PCB, the activity of the programming depends on the information in data storage files. BdFiles 1400 stores test procedures for a particular PCB. ICOutFiles 1500 stores out-of-circuit, IC test models, including information necessary for functional testing. ICOutFiles are typically developed by the vendor for a majority of industry standard components, but may be user developed with ICLearn 1300. ICInFiles 1600 contain modified out-of-circuit IC test models to reflect in-circuit conditions.

If a test procedure for a known good PCB already is stored in BdFiles 1400 and information about its components is stored in ICInFiles 1600, the operator may test an unknown PCB by running BdTest 1000.

If no test procedures have yet been developed, but information about the board's components are stored in ICOutFiles 1500, the operator must run BdTestGen 1100 and BdSchLearn 1200 before running BdTest 1000. As explained below, BdTestGen 1100 prompts the operator to enter board layout and component data. BdSchLearn 1200 is run using a known good board to learn the interconnections among components and to modify the out-of-circuits information to match in-circuit conditions.

More extensive learning is required if out-of-circuit information about a component is not stored in ICOutFiles 1500. In this event, the operator must also run ICLearn 1300 to input information required by the invention.

Figure 12:
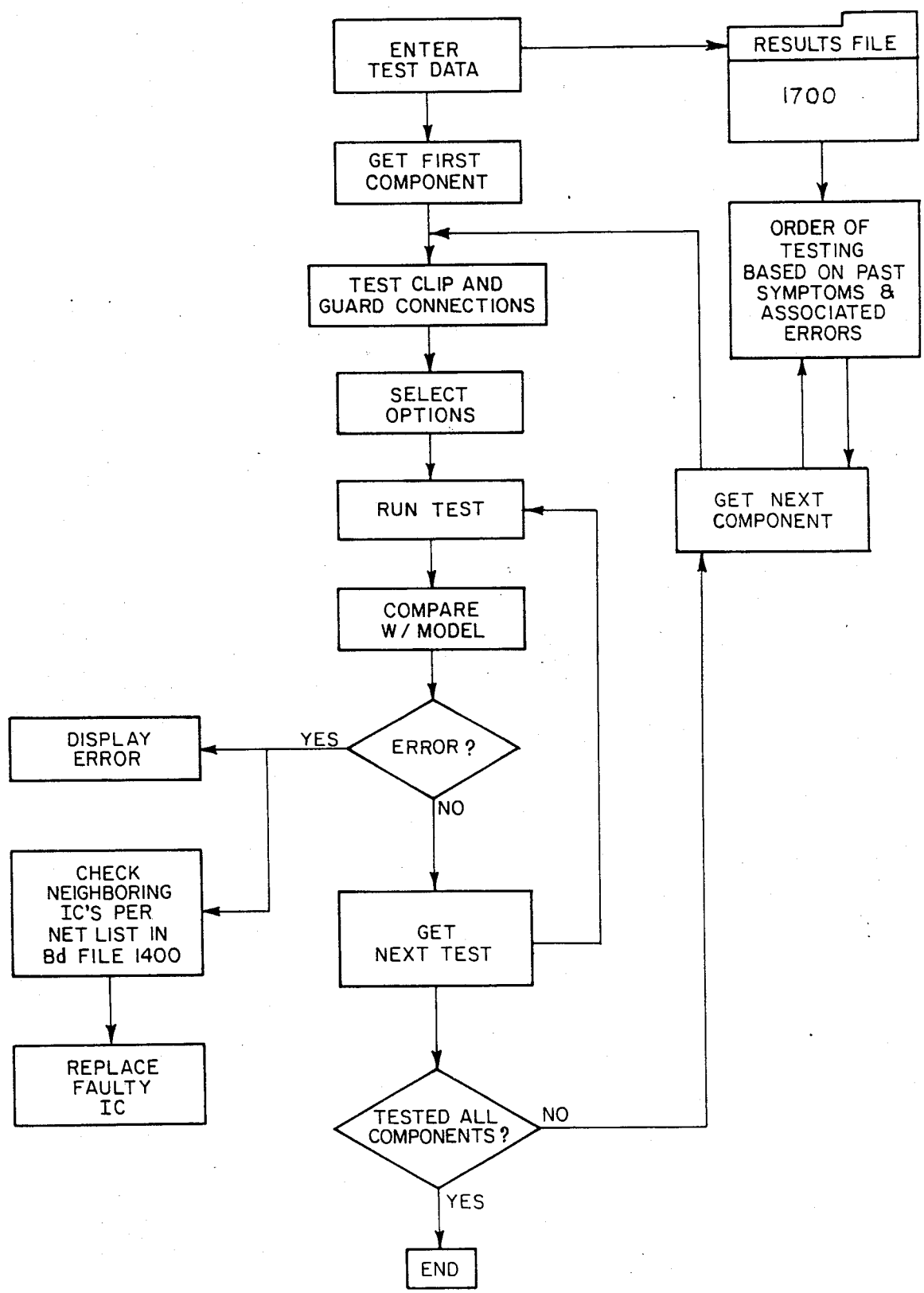
FIG. 12 is a flowchart showing the basic procedure used by the system's programming to test a suspected PCB.
Figure 13:
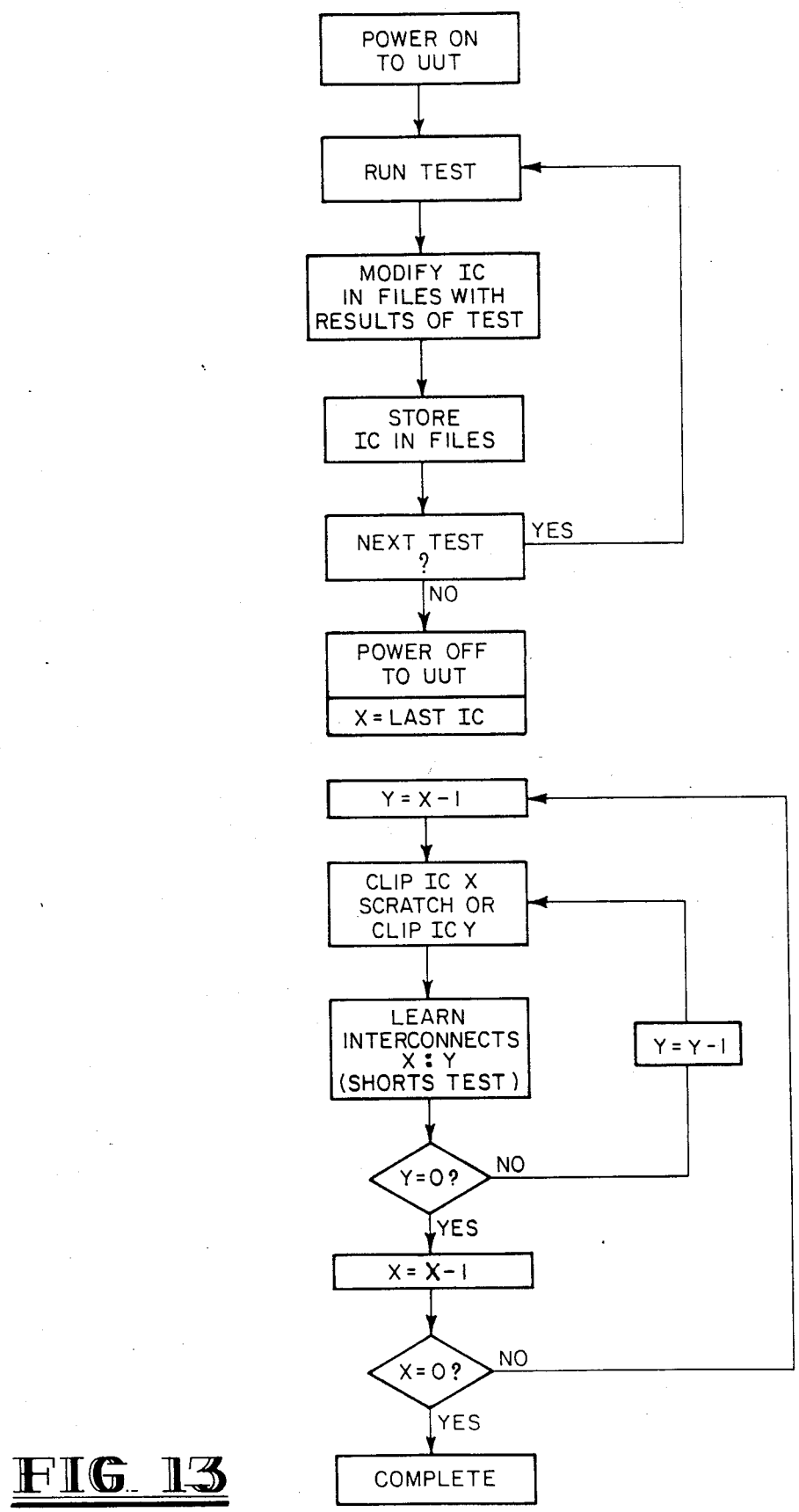
FIG. 13 is a flowchart showing the basic procedure used by the system's programming to learn the features of a known good PCB and its components.

Computer programs following the flow charts illustrated in FIGS. 12 and 13 show the basic procedure of BdTest 1000 and BdSchLearn 1200. BdTestGen 1100 and ICLearn 1500 are primarily data entry programs. FIGS. 12 and 13 together with the following description of the test programming, are believed to be sufficiently instructive of the basic logic of the testing sequence to allow the writing of corresponding computer programs in any of a number of computer languages. In the preferred embodiment, the language is C.

Board Test Program

As represented in FIG. 12, the operation of the invention to test a PCB uses BdTest 1000. It is assumed that a test for the particular type of PCB has been developed as will be explained below and that the procedure is stored in executable form in BdFiles 1400. Thus, the invention has access to a model, which models a known good PCB. This model is stored in memory of host system 10 for purposes of testing a suspected PCB, the PCBUT.

In most general terms, BdTest 1000 uses circuit-specific information that describes the model and compares the model with the observed operation of the PCBUT. BdTest 1000 executes several phases, which are interactive with the test operator. After each PCBUT is tested, BdTest 1000 returns to a board selection phase, and repeats until no PCBUT is selected.

The operator first connects the PCBUT to the test equipment. The operator then calls BdTest 1000 through the main menu as shown in FIG. 10. BdTest 1000 prompts the operator to enter certain information, such as the operator's name and a unit identification code. With this information, all test results for a specific PCB can be traced to a specific unit of test equipment and operator. BdTest 1000 then prompts the operator to identify the PCBUT by its type, i.e., diagnostic, memory, sensor, logic, control, or heat sink, and its serial number.

BdTest 1000 then displays a list of possible symptoms. The operator may select a symptom that matches the reported symptom of the PCBUT. BdTest 1000 accesses ResultsFile 1700 and identifies components whose failures are associated with that symptom. This causes BdTest 1000 to first test the components most likely to cause that symptom. Thus, the sequence of components tested is determined by a test order specified during BdTestGen 1100, as modified by the component failure history. During testing, BdTest 1000 instructs the operator which control panel connector and which component to connect to clip connectors 121A-121F, using clip 123.

BdTest 1000 also instructs the operator which guard point connections to make. To install a guard, the operator uses guard points 124A-124F and guard clip 121F. These guards are attached to corresponding points as prompted on display 56. Prior to testing each IC, BdTest 1000 checks all guard points and interrupts execution if a required guard is missing.

After prompting the operator to clip a particular CUT, BdTest 1000 permits a number of options: the faults may be displayed, BdTest 1000 may be terminated, the connections between the CUT and the other components on the board may be displayed, or a list of components may be displayed and the test order overridden by the test operator.

If the operator selects to view faults, BdTest 1000 runs one or more tests on the CUT. The tests determine the following possible errors: (1) improper clip contacts, (2) illegal shorts, (3) illegal opens, (4) out of range pre-functional voltage, (5) functional errors, and (6) out of range post-functional voltage.

Clip Contacts Test

This passive test determines whether the operator has correctly connected the CUT to one of clip connectors 121A-121F. If a clip is already connected to the CUT, BdTest 1000 requests the operator to remove it. The operator is then requested to place the clip on the specified component. It compares the specified connector with the pin connection information stored in BdFiles 1400, and further testing proceeds only if the CUT is properly clipped. If the CUT is properly clipped, BdTest 1000 executes the remaining tests.

Opens Test

The model is BdFiles 1400 designates pins on the CUT as being inputs, outputs, or tristate. By reference to the model, BdTest 1000 checks input pins of the CUT for opens.

Pre-functional Test Voltage Test

This passive analog test measures for voltages at designated pins on the CUT to determine whether they are within a window of high and low references supplied to comparator 810 from the model value. If an error is suspected, the values are displayed on display 56. The overall range of voltage that can be detected is 10.0 volts to 100 volts. Voltage determinations are to 12 bits of precision.

Shorts Test

This active test locates shorts. It verifies whether a short is intentionally placed or is a source of failure. The shorts test includes a test for shorts to ground or supply, or "stucks." If a pin on the CUT shows shorted, stuck high, or stuck low, an error screen is displayed showing the high or low states of expected shorted pins on the model IC and of points on the CUT.

Functional Test

The functional test bursts in test steps as developed by test programmers, as modified by BdSchLearn 1200 for in-circuit conditions. The invention bursts high or low levels at input points of the CUT. There are two possible functional test results: The first result is whether a pin is high, low, or tri-state. If a difference between the expected outputs of the known good component and the CUT is detected, the invention displays them both, indicating the faulty pin. The second result is whether a pin is supposed to transit to a state during the test. If the pin did not transit, the invention indicates this fault to the operator.

Guarding is used during functional testing of digital IC's. If an output of an upstream component is an input to the CUT, that output may be backdriven to a desired state. This permits the invention to control the CUT input, regardless of the state to which it would otherwise be held by the upstream IC. To perform an in-circuit test of a CUT, power is applied to the board, high and low logic levels are defined, the pins to be driven or sensed are specified, the appropriate backdriving is applied, and a test pattern is applied. The test pattern may be serial or 8-bit parallel.

Post-Functional Test Voltage

This is an analog test for voltages at the CUT after the functional test. An example of the usefulness of this test is with hybrid devices such as DAC's.

The sequence in which these tests are run is a strategic order, or testing gateway system. Passive tests are performed before active tests. Thus, errors such as the absence of pin contact, prefunctional voltage, and opens are tested for first. After these tests, there is a high confidence that the proper component is clipped, power is applied, and all supply voltages are within a specified range. Then, the active tests for shorts and functionality use the driver/sensor circuitry to gather data so that the error can be detected. At any point during execution of BdTest 1000, if an error is detected, an error message is displayed to the operator.

BdTest 1000 performs these tests in less than one second. Each test is independent in the sense that the results of a failed test are separately indicated to the user. If an IC fails any one of the tests, BdTest 1000 generates output to display 56. This output shows the operator a diagram of the failed IC, the value expected, and the value actually obtained from the IC. This output can also be directed to a printer for a hard copy.

Depending on which of the tests was failed, the operator then may choose to test other IC's to which the CUT was connected. For example, if connecting pins on two different IC's are "bad", the operator may conclude that the interconnection between the IC's is bad. If the interconnections test "good", then the operator may conclude that the CUT is bad.

After each component is tested, BdTest 1000 displays a test results screen on display 56. This screen informs the user which IC's were tested, which IC's initially failed but passed after retest, and which IC's failed. BdTest 1000 then permits the operator to select whether to retest any or all of the IC's, whether to end BdTest 1000, or whether to print the results.

ResultsFiles 1700 stores error data when the PCBUT is tested. Specifically, when a faulty component is detected, the component's identification is recorded with the selected symptom. In this manner, the invention builds a data base relating symptoms to faulty components. It also stores other historical information, such as what board was tested, the identity of the operator, why the test was performed, and the length of the test. Such data can later be used for test management. Additionally, after a failed PCB is repaired, information about the nature of the repairs can be entered into ResultsFiles 1700. This information can be used to expedite future testing and repair of the same type PCB.

Expert system programming is used to analyze and interpret the information in ResultsFiles 1700. Using statistical methods, the tester determines in order of probability, which IC's are the most frequent sources of error for a particular type of PCB per symptom. Thus, in future testing of the same type PCB, the tester informs the user that IC's are most likely to be the source of the problem and the best test order, and what repairs are necessary.

Board Test Generator

BdTestGen 1100 is used to develop or modify a test procedure for a specific PCB. It collects data, which is then stored in BdFiles 1400. BdTestGen 1100 executes if the test operator selects it from the main menu shown in FIG. 10. Generally, BdTestGen 1100 prompts the operator to enter information on three levels: the PCBUT, its components, and the pins and guardpoints on each component.

More specifically, the board level information includes: the board name, the board's physical dimensions, the number of its components, master backdrive points, and the symptoms of failed boards. This information is global with respect to each component on the board. Specification of a master guard point will cause BdTest 1000 to prompt the operator to use guard points 124A–124F or clip connector 121F to connect a point to a high or low rail during testing.

The component level information includes: the vendor's model name, a library name, a board identification, a test name, the number of pins, the tests to be performed, the component's width, where the test clip will connect to front panel 100, the component's horizontal position, the component's vertical position, the orientation of the component on the board, the test order, the low voltage drive ("low rail"), and the high voltage drive ("high rail"). The test name is supplied by ICOutFiles 1500 if it has been stored there. The test name is also used to access ICOutFiles for other information, such as the number of pins, the tests to be performed.

At the component level, there are two categories of information: guard information and pin information. The operator is first prompted to enter the model name, BdTestGen then access ICOutFiles 1500. If the component is in ICOutFiles 1500, the stored information about the component may be retrieved, eliminating the need for duplicative data input. If the component is not in ICOutFiles 1500, operator supplied information can be entered and stored there for future use.

The guard information is for guarding the CUT during testing. This information includes: component identification, the pin of the component to be guarded, which among guard points 124A-124F or connector 121F to use, and whether a high or low voltage is to be applied. The guard point information can be obtained from the master guard information entered at the component level.

The pin information includes: which of the six tests are to be performed, the type of pin, a high/low voltage tolerance level to be used by a prefunctional voltage test, a low/high voltage to be used by a post-functional voltage test, and pin connections. The pin test selections are: contacts, opens, shorts, pre-functional voltage, post-functional voltage, and strength of output drive. Pin types are: input, output, tri-state, no connect. The pre-functional and post functional voltages are specific high/low tolerance level to be used by the respective pre-functional and post-functional voltage tests. The pin connections information includes connections to power supply, to other pins in that component, and to pins of other components. Five connections are reserved to supply designations to ground, +5 volts, +12 volts, −12 volts, and −5 volts. Connections to other pins are indicated by a three character code. To indicate a known connection with another pin, BdTestGen 1100 prompts the operator to designate a component and a pin. Most pin connects, however, are sensed and learned during BdSchLearn 1200, as explained below.

Board Schematic Learn

BdSchLearn 1200 creates circuit-specific test procedures for each component to be tested. It obtains information from controller 400 and from ICOutFiles 1500. It uses this information to modify functional test procedures stored in ICOutFiles 1500 and thereby creates ICInFiles 1600.

BdSchLearn 1200 leads the test operator through a known-good PCB and prompts the operator to successively connect CUT's on the PCB. This permits access of each driver/sensor cluster 600 to a CUT, so that measurements at points on the CUT can be made.

BdSchLearn 1200 uses display 56 for communication with the test operator. A graphic display shows a board outline, clip connectors 121A-121F and guard points 124A-124F. BdSchLearn 1200 automatically obtains the dimensions of the PCB, the identity of each declared component, with the number of pins and width, from information entered by the test operator during BdTestGen 1100. The components are displayed on the PCB at their specified horizontal and vertical positions.

As BdSchLearn 1200 executes, clip components, clip connectors, and guards are highlighted to guide the test operator. The test clip and guard connect information is obtained from the information supplied during BdTestGen 1000. For example, if clip connector 121A is to be connected to component U1, both are highlighted on display 56.

BdSchLearn 1200 executes after being selected by the test operator from the main menu shown in FIG. 10. The first step on BdSchLearn 1200 is to request and accept input from the test operator identifying the name of the PCB to be learned. After a selection is made, BdSchLearn 1200 consists of two major steps: powered and non-powered. The powered step performs tests on each component with voltage applied to the PCB. The non-powered step detects interconnections among components to develop a node list of the PCB.

During the powered step, power is first applied to the PCB. The auxiliary power connector on control panel 100 may be used for this purpose. The operator is then prompted to set up appropriate guards and to clip components. The first step is the placing of master guards to the circuit, as specified during BdTestGen 1100.

Then BdSchLearn 1200 prompts the operator to successively clip each component that has been qualified for testing. This qualification automatically occurs as a result of a connector having been specified for that component during BdTestGen 1100. The order of the clipping of the components is also obtained during BdTestGen 1100. As each component is clipped, guard points are updated.

BdSchLearn 1200 then executes one or more tests on each CUT, as specified by the test operator during BdTestGen 1100. In general, these tests create a circuit-specific component test procedure by comparing a model procedure with one acquired during ICLearn 1300 execution, and then modifying the model to reflect the operation of the component within the known good circuit. This is necessary because the implementation of a component within the circuitry of a PCB may vary from the vendor's data. In particular, BdSchLearn 1200 measures test voltages, guard points, delays to the CUT. It measures static analog information, such as board power consumption and pin drive current capacity.

In all but the contacts and opens tests, the learning tests modify the model tests stored in ICOutFiles 1500. Contacts learning disables any pin for which there is no contact and opens learning is disabled for inputs that are learned to be truly open.

Prefunctional and postfunctional voltage learning measures voltages on all pins for which measurements are requested. Limits of plus or minus 500 millivolts are set. This test is modified in the case of a short to supply voltage. The measurement range is −10 volts to +10 volts at every pin with 20-millivolt accuracy.

Shorts learning determines and stores the actual short and stuck connections for all pins. If stuck connections are found, the algorithm measures the voltage and enables the prefunctional test to check this parameter.

In functional learning there are three considerations. First, if input pins are shorted to one another, the driving is removed from all but one. Second, if outputs are shorted to inputs, the input stimulus is removed for the duration of the program's request for sensing on the output. Third, if the output is required to be sensed, the out of circuit's sense is overwritten by the in-circuit learned sense result.

After BdSchLearn 1200 executes these tests, the test operator may store the results in ICInFiles 1600. BdSchLearn 1200 then prompts the operator to remove power from the board and ground the board. BdSchLearn 1200 then uses a shorts test to sense the interconnections between components, or nodal loads, on the PCB. Two methods are used: component pin scratching and IC clipping.

To use pin scratching, BdSchLearn 1200 prompts the operator to clip a reference CUT to a clip connector 121A-121F and to scratch all of the pins of a target IC with a sharp probe, which is connected to a guard point 124A-124F. This determines whether there is an electrical connection between the target and the reference IC. If a connection is sensed, BdSchLearn 1200 displays both components on display 56 and prompts the operator to sequentially probe designated pins of the target component. Connections between pins are then sensed and displayed.

IC clipping may be used if the reference IC has 28 or fewer pins and the target IC has 24 or fewer pins and can be clipped. A clip 123 is connected to connector 121F on front panel 100. BdSchLearn 1200 prompts the operator for a scratch clip connection between connector 121F and the target IC. BdSchLearn 1200 then senses any interconnections and displays them on display 56.

This process may be used to learn the entire schematic of the PCBUT by sequentially testing each component on the PCB as a reference component and testing for interconnections against all other components. If desired by the operator, BdSchLearn 1200 stores data acquired by it in ICInFiles 1600.

IC Learn

As indicated in FIG. 11, ICLearn 1300 is used to create or edit functional test procedures at the component level. ICLearn 1300 is executed if the test operator selects the appropriate item from the main menu as shown in FIG. 10.

To view, create, or edit a source code for an IC functional test, the operator uses a text editor. The text editor can be any of a number of commercially available text editors capable of generating standard ASCII code. Formatting options should be disabled when using the text editor with the invention.

The source procedure language uses command statement verbs and command statement adverbs. The following table shows the command statement verbs, and illustrates what information about out-of-circuit IC's is entered into and test programming by the test operator:

| VERB | DESCRIPTION |
| --- | --- |
| PIN nnn | Sets the number of pins on the IC. |
| SET (TTT, v.vvv); | Sets the threshold and drive voltages. |
| IH nnn; | Sets the designated pin (nnn) to input high. |
| IL nnn; | Sets the designated pin (nnn) to input low. |
| OH nnn; | Pin (nnn) is to be checked for a high state. |
| OL nnn; | Pin (nnn) is to be checked for a low state. |
| OX nnn; | Disables driving (input pins) or disables sensing (output pins) on pin (nnn). |
| OT nnn; | Sets the designated pin (nnn) as an output pin in a tri-state condition (between the low and high sense thresholds.) |
| OST nnn; | Pin (nnn) is to be checked for tri-state to occur at once during the test. |
| OSL nnn; | Pin (nnn) is to be checked for a low state to occur at least once during the test. |
| OSH nnn; | Pin (nnn) is to be checked for a high state to occur at least once during the test. |
| CLOCK (nnn,ttt); | Generates two test states for the designated pin (nnn) for each tick of the number of ticks (ttt). |
| X; | Indicates the end of a test step. |
| BROAD; | Sets the test mode to 8-point parallel operation. |
| SLEW; | Sets the test mode to serial operation. |
| SETI NN,nnn; | Sets the integer (NN) to a value of (nnn). |
| TEST NN,nnn; | Sets up a comparison between the stored integer value (NN) and the declared integer value (nn). The result of the comparison is examined by the IF and NEXT verbs. |
| INCI NN,nnn; | Increments the stored integer value (NN) by the integer value (nnn), which can be negative. |
| LOOP LL; | Sets one of ten loop controls. LL is in the range from 1 to 10. The information provided by the loop verb is used by subsequent NEXT verbs to achieve compiler looping. The NEXT operations causes the compiler control to start with the line following the loop command. |
| NEXT LL,TC; | Examines the result of the last TEST operation, and compares it with the declared test condition (TC). If the test condition matches the declared condition, the present command line is completed, after which compiler operation proceeds with the command line following the LOOP LL; command. If the test condition does not match, compiler operation proceeds with the next command line. |
| IF TC; | Examines the result of the last TEST verb operation, and compares it to the declared test condition (TC). If the last TEST condition matches (TC), the remainder of this command line is processed. If not, the remainder of this command line is ignored and compiler operation proceeds with the next command line. |
| EQUATE KEY, REPLACEMENT VAL; | Causes subsequent test values equating to (KEY) to be replaced with (REPLACEMENT VAL). The compiler will store up to 64 keys and replacement values. Each key may consist of up to 16 characters. Replacement values may consist of up to 64 characters. If the equate verb is the first command statement on a command line, the replacement value represents the remainder of the line (including semi-colons). If not, the replacement value consists of the remainder of the current command statement. |
| IGH nnn; | Allows the tester to ignore high states of pin (nnn). |
| IGL nnn; | Allows the tester to ignore low states of pin (nnn). |
| IGT nnn; | Allows the tester to ignore tri-state conditions of pin (nnn). |
| II nnn; | Allows the tester to invert the state of pin (nnn). |
| IR nnn; | Allows the tester to randomize input pin (nnn). |
| SEED nnn; | Uses the number (nnn) to seed a random number operator for the next occurrence of the IR verb. |
| INCLUDE FILENAME; | Causes the file named (FILENAME) to be included in the functional test as if it were a part of the initial source file. |
| END; | Causes compiler operation to end. |

Command statement adverbs are used to express voltage levels, results of a compare operation, and integer indicators. Results of compare operations are: less than, equal to, greater than, less than or equal to, greater than or equal to, or not equal. Integer indicators are: component pin numbers, loop indices, variable item indices, and clock ticks.

Figures 14A, 14B:
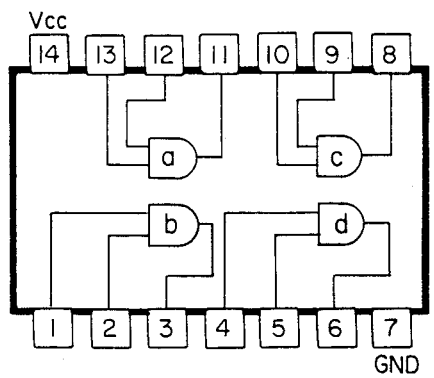
FIG. 14a and FIG. 14b show an sample IC to be learned by the system's programming and a representative sample of IC test program data entry.

FIGS. 14a and 14b are a sample CUT and a partial code listing to illustrate a test program developed with ICLearn 1300 for a digital IC. In line 1 of FIG. 14b, the CUT is identified as 7400, containing four NAND gates. Lines 1–5 contain component level information, which is usually the same for any test for the IC. Lines 6–10 test the logical operation of gate c. Lines 11–16 test the logical operation of gate d. In this manner, two more similar blocks of code will test the other two NAND gates of the 7400 IC. The test program will terminate with the END verb.

ICLearn 1300 includes a compiler. After a source procedure such as shown in FIG. 14b is entered, it is compiled to produce a generic component test. This test is stored in ICOutFiles 1500.

Although the invention has been described with reference to specific embodiments, this description is not meant to be construed in a limiting sense. Various modifications of the disclosed embodiment, as well as alternative embodiments of the invention will become apparent to persons skilled in the art upon reference to the description of the invention. It is therefore contemplated that the appended claims will cover such modifications that fall within the true scope of the invention.

We claim:

1. An apparatus for testing electrical circuits and components in them, for use with a microcomputer having a microprocessor, input and output means, memory, and data, control, and address busses, comprising:
   a controller in electrical connection with said microcomputer and with access points of said circuit under test, said controller receiving digital test data from said microcomputer for determining a high rail reference voltage, a low rail reference voltage, a high threshold reference voltage, and a low threshold reference voltage and having digital to analog converters for converting said digital test data into said high rail reference voltage, low rail reference voltage, high threshold reference voltage, and low threshold reference voltage;
   a primary power supply in electrical connection with an AC source, with said controller, and with points of said circuit under test, said primary power supply receiving said top rail reference voltage and said low rail reference voltage from said controller and delivering a high rail voltage and a low rail voltage to said access points;
   a unit under test power supply in electrical connection with an AC source and with said circuit under test, said unit under test power supply delivering power to said circuit under test;
   a plurality of driving circuits in electrical connection with said microcomputer, with said high rail voltage, and with said low rail voltage, and with said access points, said driving circuit having means for delivering voltage to said access points at a high or low state corresponding to said high rail voltage and to said low rail voltage;
   a plurality of sensing circuits in electrical connection with said microcomputer, with said access points, and with said controller, said sensing circuits receiving said high threshold reference voltage and said low threshold reference voltage from said controller and having means for comparing said threshold reference voltages to output at said access points, said sensing circuits being in communication with said microcomputer so that the output from said sensing circuits may be delivered to said microcomputer for use;
   a control unit in electrical connection with said controller and with said driving and said sensing circuits, said control unit having at least:
     means for connecting said driving circuits to said access points so that a number of said access points are each in electrical connection with one of said driving circuits, and
     means for connecting said sensing circuits to said access points so that a number of said access points are each in electrical connection with one of said sensing circuits.

2. The apparatus claimed in claim 1, wherein said driving circuits provide a means for guarding said access points during testing.

3. The apparatus claimed in claim 1 further comprising a switch for controlling whether said rail voltages shall be delivered to said driving circuits.

4. The apparatus claimed in claim 1 wherein each of said driving circuits determines the voltage levels to be delivered to said access points by shifting high and low voltage levels delivered to said driving circuits from said microcomputer.

5. The apparatus claimed in claim 1, wherein each of said driving circuits has a switch means for switching between said high rail voltage and said low rail voltage.

6. The apparatus claimed in claim 5 wherein said switching means in said driving circuits is comprised of low output impedance transistors.

7. The apparatus claimed in claim 6, wherein said transistors are field effect transistors.

8. The apparatus claimed in claim 6, wherein said field effect transistors are CMOS field effect transistors.

9. The apparatus claimed in claim 1 wherein said connection means for connection of said driving circuits and said sensing circuits to said access is a clip having electrical connection points securable on a one-to-one basis to said access points.

10. The apparatus claimed in claim 1 wherein said each of said sensing circuits further comprises a pair of resistors for measuring impedance.

11. An apparatus for testing electrical circuits and components in them, comprising:
    a microcomputer having at least a microprocessor, input and output means, memory, and data, control, and address busses;
    a controller in electrical connection with said microcomputer and with access points of said circuit under test, said controller receiving digital test data from said microcomputer for determining values of a high rail reference voltage, a low rail reference voltage, a high threshold reference voltage, and a low threshold reference voltage and having digital to analog converters for converting said digital test data into said high rail reference voltage, low rail reference voltage, high threshold reference voltage, and low threshold reference voltage;
    a primary power supply in electrical connection with an AC source, with said controller, and with points of said circuit under test, said primary power supply receiving said top rail reference voltage and said low rail reference voltage from said controller and delivering a high rail voltage and a low rail voltage to said access points;

a unit under test power supply in electrical connection with an AC source and with said circuit under test, said unit under test power supply delivering power to said circuit under test;

a plurality of driving circuits in electrical connection with said microcomputer, with said high rail voltage, and with said low rail voltage, and with said access points, said driving circuit having means for delivering voltage to said access points at a high or low state corresponding to said high rail voltage and to said low rail voltage;

a plurality of sensing circuits in electrical connection with said microcomputer, with said access points, and with said controller, said sensing circuits receiving said high threshold reference voltage and said low threshold reference voltage from said controller and having means for comparing said threshold reference voltages to output at said access points, said sensing circuits being in communication with said microcomputer so that the output from said sensing circuits may be delivered to said microcomputer for use;

a control unit in electrical connection with said controller and with said driving and said sensing circuits, said control unit having at least:

means for connecting said driving circuits to said access points so that a number of said access points are each in electrical connection with one of said driving circuits, and means for connecting said sensing circuits to said access points so that a number of said access points are each in electrical connection with one of said sensing circuits.

12. The apparatus of claim 11, and further comprising a computer program for use with said microcomputer, said computer program providing a procedure for guided fault isolation for use by a test operator.

13. The apparatus of claim 11, and further comprising a computer program for use with said microcomputer, said computer program providing procedures for testing said components for use by a test operator.

14. The apparatus of claim 11, and further comprising a computer program for use with said microcomputer, said computer program providing means for generating a test procedure for testing a printed circuit board having components whose functional outputs or parameters are unknown, for use by a test operator.

15. The method of claim 11, and further comprising a computer program for use with said microcomputer, said computer program providing means for generating a test procedure for testing interconnections among said components, for use by a test operator.

16. The apparatus claimed in claim 11, wherein said driving circuits provide a means for guarding said access points during testing.

17. The apparatus claimed in claim 11 further comprising a switch for controlling whether said rail voltages shall be delivered to said driving circuits.

18. The apparatus claimed in claim 11 wherein each of said driving circuits determines the voltage levels to be delivered to said access points by shifting high and low voltage levels delivered to said driving circuits from said microcomputer.

19. The apparatus claimed in claim 11, wherein each of said driving circuits has a switch means for switching between said high rail voltage and said low rail voltage.

20. The apparatus claimed in claim 19 wherein said switching means in said driving circuits is comprised of low output impedance transistors.

21. The apparatus claimed in claim 20 wherein said transistors are field effect transistors.

22. The apparatus claimed in claim 19, wherein said field effect transistors are CMOS field effect transistors.

23. The apparatus claimed in claim 11 wherein said connection means for connection of said driving circuits and said sensing circuits to said access points is a clip having electrical connection points securable on a one-to-one basis to said access points.

24. The apparatus claimed in claim 11 further comprising a language means for entering information pertaining to said circuit under test and means for compiling said language means so that said information may be processed by said computer for use during testing.

25. A method for testing a circuit having electrical components, with aid of a microcomputer, comprising the steps of:

providing a data base to said microcomputer, said data base including at least:
input access points and output access points of a known to be good model component, and
values representing inputs and outputs of said model component;

connecting pins for driving and sensing to said access points on one of said components under test, while said component is in-circuit;

driving inputs of said component under test to a desired state at access points that correspond to input points of said model components;

sensing outputs of said component under test at points that correspond to output points of said model component;

comparing outputs of said component under test with said model;

electronically communicating the results of said comparison to said microcomputer;

displaying said results on a display means of said microcomputer; and repeating said steps until a number of said components in said circuit have been tested.

26. The method of claim 25 wherein said comparing step comprises comparing functional values of said component under test with said model.

27. The method of claim 25 wherein said comparing step comprises comparing out-of-circuit characteristics of said component under test with said model.

28. The method of claim 25, wherein said step of repeating said steps comprises providing guided fault isolation to a test operator, using computer programming of said microcomputer, wherein said programming guides said operator through the test procedure.

29. The method claimed in claim 25, wherein the step of providing a data base further includes the step of providing information about what points of said component under test are to be guarded and further comprising the steps of attaching guard means to said guard points and backdriving a desired input at said guard points.

30. The method claimed in claim 25, wherein the step of providing a data base further includes the step of providing information about shorts within said component under test, and further comprises the step of successively driving pairs of access points on said component and measuring the output of said access points to determine whether there is a short between them.

31. The method of claim 30, wherein said step of successively driving access points further comprises determining whether said access points are stuck to a supply voltage source or to ground.

32. The method of claim 30, wherein said step of successively driving access points comprises driving said access points with two switches, each at a different voltage level, and determining whether the output of said access points indicates that said switches oppose each other.

33. The method claimed in claim 25, wherein the step of providing a data base further includes the step of providing information about legal opens at access points of said component under test, and further comprising the step of testing for illegal opens.

34. The method claimed in claim 25, wherein the step of providing a data base further includes the step of providing information about voltage levels at designated access points of said component under test, and further comprising the step of determining whether voltage levels at said access points are within range of said provided voltage levels information.

35. The method claimed in claim 25, further comprising the step of testing to ensure that said connections from said driving and sensing pins to said access points on said component under test have been correctly made.

36. The method claimed in claim 25, wherein the step of providing a data base further comprises the step of providing information about legal interconnections among components of said circuit, and testing for shorts between said connections so that illegal interconnections may be traced.

37. The method claimed in claim 25, further comprising the steps of storing test result data and analyzing said data, using said microcomputer, and modifying the sequence of said repeating steps in response to said analyzing step.

38. The method claimed in claim 25, wherein said step of displaying said results includes displaying a picture of said component under test and of said model and information about said access points of said component under test and said model.

39. A method for learning the characteristics of a circuit having electrical components, by testing said circuit and its components, with aid of a microcomputer, comprising the steps of:
providing a data base to said microcomputer, said data base including at least:
input access points and output access points of a known to be good model component, and
values representing inputs and outputs of said model component;
connecting pins for driving and sensing to said access points on one of said components under test, while said component is in-circuit;
driving inputs of said component under test to a desired state at access points that correspond to input points of said model components;
sensing outputs of said component under test at points that correspond to output points of said model component;
comparing outputs of said component under test with said model;
electronically communicating the results of said comparison to said microcomputer;
modifying said model in said data base to correspond with said sensed outputs; and
repeating said steps until a desired number of components have been tested.

40. The method of claim 39, and further comprising the step of programming said microcomputer to accept information about a component of said circuit and the step of inputting said information to said microcomputer to be stored in said database.

41. The method claimed in claim 39, wherein the step of providing a data base further includes the step of providing information about what points of said component under test are to be guarded and further comprising the steps of attaching guard means to said guard points and backdriving a desired input at said guard points.

42. The method claimed in claim 39, further comprising the step of successively driving pairs of access points on said component under test and measuring the output of said access points to determine whether there is a short between them.

43. The method claimed in claim 39, further comprising the step of testing for connections between said component under test and a voltage supply of ground.

44. The method claimed in claim 39, further comprising the step of testing for opens at input access points on said component under test.

45. The method claimed in claim 39, further comprising the step of measuring voltages at access points of said component under test.

46. The method claimed in claim 39, further comprising the step of testing to ensure that said connections from said driving and sensing pins to said access points on said component have been correctly made.

47. The method claimed in claim 39, further comprising the step of methodically and successively testing access points of said component under test for interconnections with access points of other components on said printed circuit board while said board is not under power, and providing said information to said data base.

48. A method for learning the interconnections among components of an electrical circuit, using a microcomputer, comprising the steps of:
providing a data base to said microcomputer, said data base comprising:
identification of each of said components whose interconnections are to be learned, and
identification of access points of each of said components;
connecting pins for driving and sensing to access points of a reference component;
connecting pins for driving and sensing to access points of a first target component;
successively testing to determine whether short circuits exist between said access points of said reference component and said access points of said target component;
disconnecting said first target component and repeating said steps with a next target component; and
disconnecting said reference component and repeating said steps with a next reference component.

49. The method of claim 48, wherein said step of connecting pins for driving and sensing to a first target component comprises scratching all pins of a target component with a probe to determine whether an electrical connection exists between said target and said reference, and further comprising the step of sequentially probing pins of said target component.

50. The method of claim 48, wherein said steps of connecting pins for driving and sensing to a reference component and to a first reference component comprises using clip connectors for each of said components, and further comprising the step of using said clip connections to sense interconnections between said reference and said target components.

51. The method of claim 48, wherein said testing step is accomplished by driving input with said driving circuit and measuring output with said sensing circuit.

52. The method of claim 48, wherein said step of disconnecting said first target component and repeating said steps with a next target component further comprises the step of eliminating target components whose interconnections have already been tested from consideration.

53. The method of claim 48, wherein said step of disconnecting said reference component and repeating said steps with a next reference component further comprises the step of eliminating reference components whose interconnections have already been considered.

* * * * *